United States Patent [19]

Iwamura et al.

[11] Patent Number: 5,047,669
[45] Date of Patent: Sep. 10, 1991

[54] TRISTATE CIRCUIT USING BIPOLAR TRANSISTOR AND CMOS TRANSISTOR

[75] Inventors: Masahiro Iwamura; Kozaburo Kurita, both of Hitachi; Hideo Maejima, Hitachi; Tetsuo Nakano, Ome; Atsuo Hotta, Higashiyamato, all of Japan

[73] Assignee: Hitachi, Ltd., Tokyo, Japan

[21] Appl. No.: 318,689

[22] Filed: Mar. 3, 1989

[30] Foreign Application Priority Data

Mar. 7, 1988 [JP] Japan .................................. 63-51494

[51] Int. Cl.$^5$ ........................................... H03K 17/16
[52] U.S. Cl. .................... 307/446; 307/443; 307/473
[58] Field of Search ............... 307/443, 446, 451, 454, 307/473, 475, 544, 550, 557, 560, 568, 570, 572, 577, 579, 584, 585

[56] References Cited

U.S. PATENT DOCUMENTS

| | | | |
|---|---|---|---|
| 4,612,458 | 9/1986 | Vasseghi et al. | 307/446 |
| 4,649,294 | 3/1987 | McLaughlin | 307/446 |
| 4,678,943 | 7/1987 | Uragami et al. | 307/443 |
| 4,682,054 | 7/1987 | McLaughlin | 307/446 |
| 4,725,982 | 2/1988 | Hara et al. | 307/473 |
| 4,740,718 | 4/1988 | Matsui | 307/446 |
| 4,804,869 | 2/1989 | Masuda et al. | 307/570 |
| 4,845,385 | 7/1989 | Ruth, Jr. | 307/570 |

Primary Examiner—David Hudspeth
Attorney, Agent, or Firm—Antonelli, Terry, Stout & Kraus

[57] ABSTRACT

In a semiconductor integrated circuit, drain-source paths of an NMOS transistor and a PMOS transistor are connected between the base and emitter of a bipolar transistor, and control signals are applied to gates of the NMOS transistor and the PMOS transistor so as to keep the NMOS transistor and the PMOS transistor at OFF condition when the bipolar transistor is operating and so as to keep the NMOS transistor and the PMOS transistor at ON condition when the bipolar transistor is in the quiescent state.

23 Claims, 15 Drawing Sheets

F I G. 13A
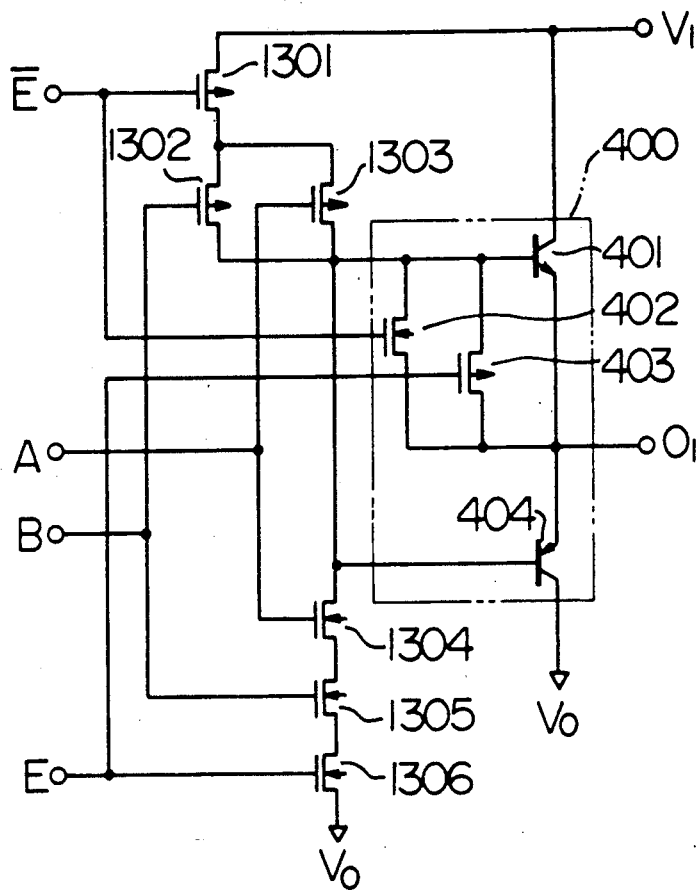
F I G. 13B
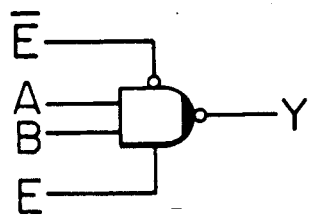

F I G. 14A
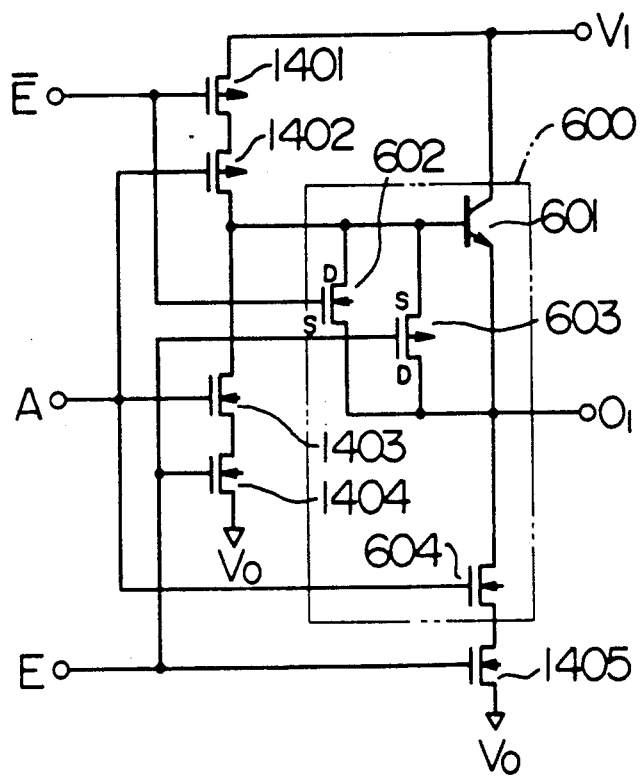
F I G. 14B
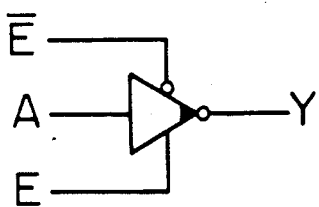

F I G. 20
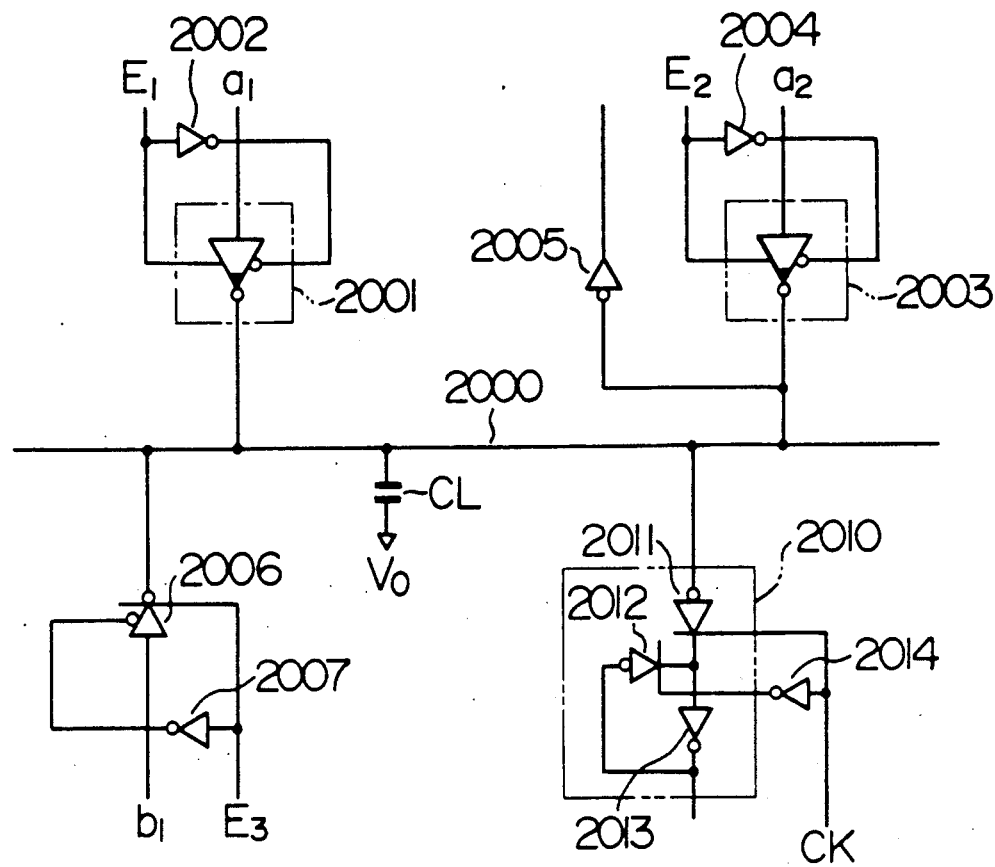

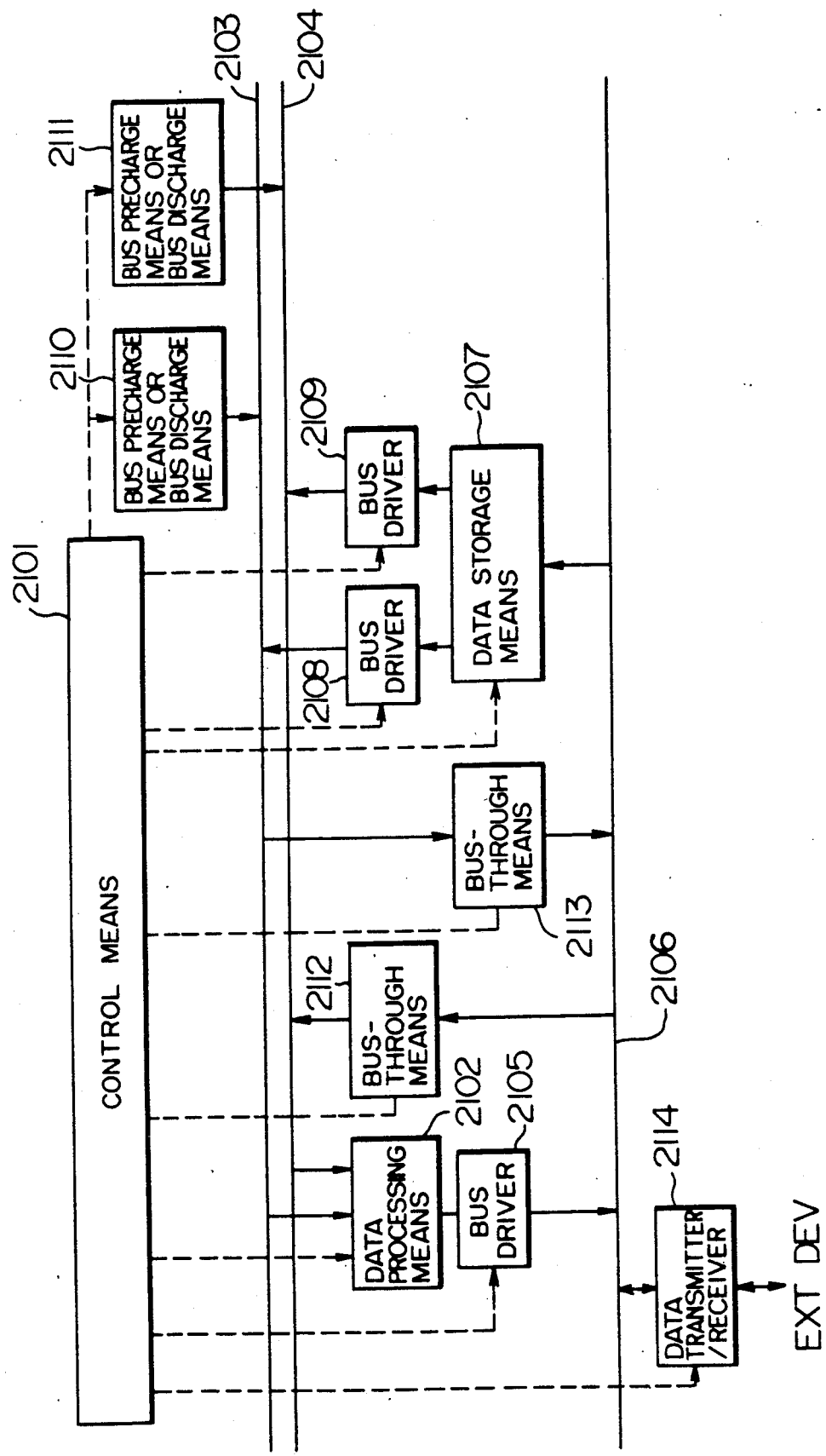

F I G. 25
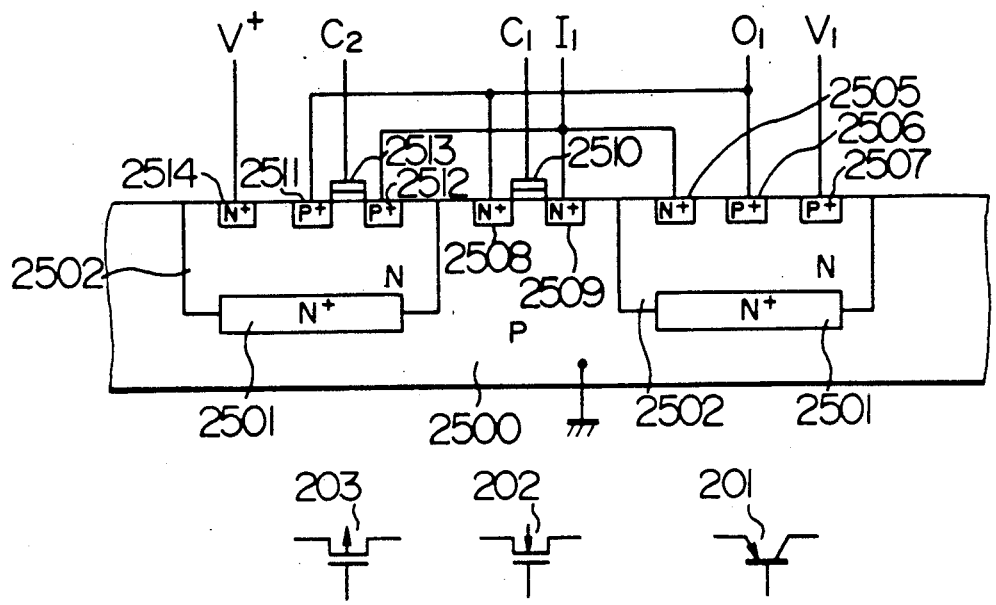

TRISTATE CIRCUIT USING BIPOLAR TRANSISTOR AND CMOS TRANSISTOR

BACKGROUND OF THE INVENTION

1. Field of the Invention

The present invention relates to a semiconductor integrated circuit apparatus, and in particular to a switching circuit, a tri-state circuit, a precharge circuit, a bus discharge circuit, a static bus system and a data processing apparatus, each of which comprises a bipolar transistor and a CMOS transistor.

2. Description of the Related Art

Hitherto, circuits comprising CMOS transistors have been widely used as static and dynamic bus drive circuits. In recent years, higher integration and higher performance of logic LSIs including microprocessors are demanded. With the advance of higher integration, the load of a bus drive circuit becomes heavy. On the other hand, a CMOS circuit has a drawback that its high-speed operation is obstructed by higher integration because its load drive capability is weak. This drawback is effectively overcome by using a BiCMOS bus driver comprising a MOS transistor at its input stage and a bipolar transistor at its output stage. However, bipolar transistors have problems such as the lowering of the current gain $h_{FE}$ due to the reverse voltage between the base and the emitter and occurrence of false base current caused by charge and discharge of parasitic capacitance associated with the base. Unless these problems are overcome, bipolar transistors cannot be activated at high speed.

FIG. 22 is a drawing for explaining the problem of reverse voltage between the base and the emitter. In FIG. 22, numeral 2201 denotes an NPN transistor having a collector connected to a power source $V_1$, an emitter connected to a bus 2200, and a base connected to reference potential (such as the ground) via a resistor 2202. The NPN transistor 2201 is in the quiescent state. Numeral 2203 denotes a tri-state driver. When a control signal E is "0", the tri-state driver 2203 is in the quiescent state, i.e., its output is in the floating state. When the control signal E is "1", an input signal a is inverted and outputted onto the bus 2200. Assuming that the amplitude of the signal existing on the bus 2200 is 0 to 5 V, reverse voltage of 0 to 5 V is applied between the base and the emitter of the NPN transistor 2201 because the base potential is 0 V. It is known that the current gain $h_{FE}$ of a bipolar transistor gradually lowers if the bipolar transistor is subjected to stress of reverse voltage between the base and the emitter. Thus, this is an important problem which must be overcome to ensure reliability.

FIGS. 23A and 23B schematically show generation of a false base current of an NPN transistor in the quiescent state. In FIG. 23A, numeral 2301 denotes an NPN transistor having a collector connected to a power source $V_{CC}$ and an emitter providing an output. And C denotes parasitic capacitance existing between the power source $V_{CC}$ and the base of the transistor 2301. If the potential of the emitter changes as shown in FIG. 23B in the quiescent state with the base current $I_B=0$, the base potential also changes similarly. Therefore, a false base current $i_b$ flows through the capacitance C, and it is amplified to produce a false collector current $i_c$.

FIGS. 23C and 23D schematically show generation of a false base current of a PNP transistor in the quiescent state. A false base current $i_b$ flows through capacitance C in the same way as the case of NPN transistor. A false collector current $i_c$ produced by the false base current can be represented as $$i_c = C \frac{dV_e}{d_t} \times \beta$$

where $\beta$ is a current amplification factor.

Assuming now that $$C = 30(fF), \frac{dV_e}{d_t} = 5(V/ns),$$

and $\beta = 50$, it follows that $$i_c = 30 \times 10^{-15} \times 5 \times 10^9 \times 50 = 7.5 (mA).$$

It is thus known that a large collector current flows in spite of the quiescent state.

This false collector current causes a large increase in power dissipation, and in addition becomes a load of another acting bus driver, its speed performance being largely degraded.

A representative circuit having a quiescent state is a tri-state circuit comprising a CMOS circuit or a BiCMOS circuit. In the BiCMOS circuit, the above described problem in the quiescent state must be overcome.

As the prior art of a tri-state circuit comprising a BiCMOS circuit, a circuit shown in FIG. 6 of JP-A-61-270916 can be mentioned. In this circuit, the above described problem of false collector current is solved, but the problem of lowering of the current gain $h_{FE}$ caused by stress of base to emitter reverse voltage of an NPN transistor is not solved.

As another example of the prior art, circuits shown in FIGS. 1 to 8 of JP-A-61-116417 can be mentioned. In circuits shown in FIGS. 1 to 4 of this example, the problem of the base to emitter reverse voltage and the problem of the false collector current are not solved yet. In circuits shown in FIGS. 5 to 8, the problem of the false collector current is not solved yet.

A further example of the prior art is a BICMOS tri-state circuit shown in FIG. 1 of U.S. Pat. No. 4,703,203.

FIGS. 26A and 26B show equivalent circuits of this circuit in the active state and in the quiescent state, respectively. However, MOS transistors fixedly set at OFF condition in respective states are removed from FIGS. 26A and 26B. Further, MOS transistors fixedly set at ON condition are represented by resistors having element numbers.

FIG. 26A shows the equivalent circuit for the active state. At this time, this circuit functions as a general BICMOS inverter. When the input $V_D$ is a "1" level, the output V becomes a "0" level. When the input $V_D$ is the "0" level, the output $V_O$ becomes the "1" level.

A PMOS 27 and an NMOS 28 represented for convenience by resistors 27 and 28 are provided to raise the output potential of "1" level to power source potential $V_{DD}$ and lower the output potential of "0" level to reference voltage $V_{SS}$.

FIG. 26B shows the equivalent circuit in the quiescent state. At this time, the output of this circuit is disconnected from the power sources $V_{DD}$ and $V_{SS}$, and the output $V_O$ is in the floating state. At this time, the base of the NPN transistor 8 is connected to the power source $V_{SS}$ via an NMOS 19 set at ON condition (and represented by a resistor 19). If the potential of the output $V_O$ is changed by the output of another tri-state circuit, therefore, the junction between the base and the emitter of the NPN transistor 8 is subjected to stress of reverse voltage. As a result, the NPN transistor 8 causes a failure or significant performance degradation incurred from the lowering in current gain $h_{FE}$.

As heretofore described, the prior art has a drawback that both the demand for reliability and demand for performance cannot be satisfied because the problems relating to the essence of a bipolar transistor in the quiescent state is not solved.

SUMMARY OF THE INVENTION

An object of the present invention is to provide a semiconductor integrated circuit comprising a bipolar transistor and a CMOS transistor in which the reliability is not lowered by the stress of base-emitter reverse voltage of the bipolar transistor in the quiescent state and a false collector current does not flow in the quiescent state.

In order to achieve the above described object, a semiconductor integrated circuit according to the present invention is so configured that drain-source paths of an NMOS transistor and a PMOS transistor may be connected between the base and emitter of a bipolar transistor, and control signals may be applied to gates of the NMOS transistor and the PMOS transistor so as to keep the NMOS transistor and the PMOS transistor at OFF condition while the bipolar transistor is operating and so as to keep the NMOS transistor and the PMOS transistor at ON condition while the bipolar transistor is in the quiescent state.

Owing to the above described configuration, the NMOS transistor and the PMOS transistor connected between the base and the emitter of the bipolar transistor are set at ON condition while the bipolar transistor is in the quiescent state. Therefore, the base and emitter of the bipolar transistor are substantially at same potential, reverse bias being prevented. Further, a false base current generated in the quiescent state flows to the output through the NMOS transistor and/or the PMOS transistor, and hence a false collector current does not flow.

BRIEF DESCRIPTION OF THE DRAWINGS

FIGS. 13A and 13B show an embodiment of the tri-state 2-input NAND circuit according to the present invention.

FIGS. 14A and 14B show an embodiment of the tri-state inverter circuit according to the present invention.

FIG. 20 shows an embodiment of a static bus system according to the present invention.

FIG. 21 shows an embodiment of a data processing apparatus according to the present invention.

FIG. 25 is a sectional view of the switching circuit of FIG. 2.

DESCRIPTION OF THE PREFERRED EMBODIMENTS

Figure 1:
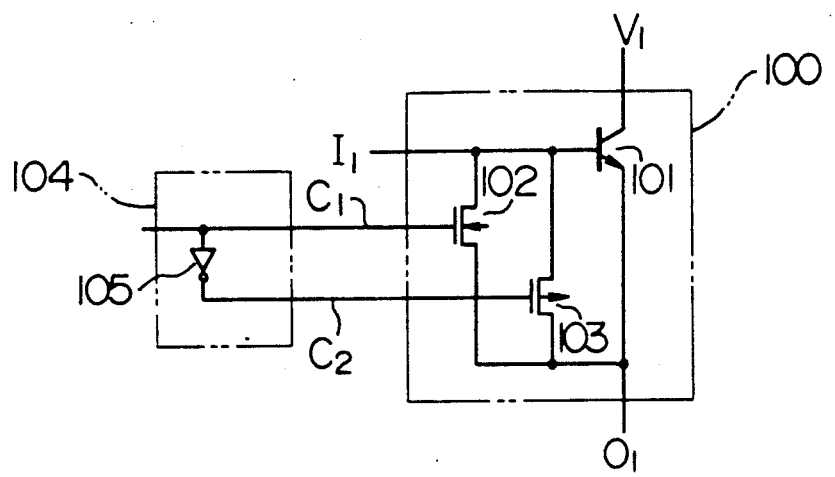
FIGS. 1 to 7 show embodiments of a switching circuit according to the present invention.

FIG. 1 shows a switching circuit 100 which is an embodiment of the present invention. In FIG. 1, numeral 101 denotes an NPN transistor (hereafter abbreviated to NPN) having a collector connected to a voltage source $V_1$, a base connected to an input $I_1$, and an emitter connected to an output $O_1$. Numeral 102 denotes an N-channel MOS transistor (hereafter abbreviated to NMOS) having a drain connected to the base of the NPN 101, a source connected to the emitter of the NPN 101, and a gate connected to a control signal $C_1$. Numeral 103 denotes a P-channel MOS transistor (hereafter abbreviated to PMOS) having a source connected to the base of the NPN 101, a drain connected to the emitter of the NPN 101, and a gate connected to a control signal $C_2$. The control signals $C_1$ and $C_2$ are supplied from a circuit 104 including an inverter 105, and are complementary each other as represented by $C_1=1$, $C_2=0$ or $C_1=0$, $C_2=1$. Both the NMOS 102 and PMOS 103 are set at either ON condition together or OFF condition together.

The operation of this circuit will now be described. Assuming now that the switching circuit 100 is in the active state, control signals represented as $C_1=0$ and $C_2=1$ are supplied so as to set both the NMOS 102 and the PMOS 103 at OFF condition. Therefore, a current supplied from the input $I_1$ flows to the base of the NPN 101 to set the NPN 101 at ON condition. On the other hand, when the switching circuit 100 is in the quiescent state, control signals represented as $C_1=1$ and $C_2=0$ are supplied so as to set both the NMOS 102 and the PMOS 103 at ON condition. At this time, therefore, the base and emitter of the NPN 101 are substantially at same potential. Even if the potential of the output $O_1$ changes from a "0" level to a "1" level, a reverse bias is not applied between the base and the emitter. Further, at this time, a generated false base current flows to the output $O_1$ through the NMOS 102 and/or the PMOS 103. It is thus prevented that the NPN 101 is set at ON condition to let flow a false collector current.

Figure 2:
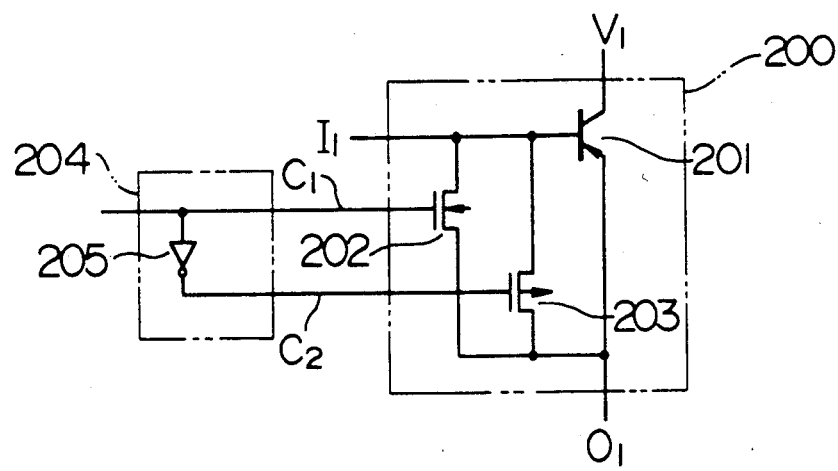

FIG. 2 shows a switching circuit 200 according to an embodiment of the present invention. In FIG. 2, numeral 201 denotes a PNP transistor (hereafter abbreviated to PNP) having a collector connected to a power source $V_1$, a base connected to an input $I_1$, and an emitter connected to an output $O_1$. Numeral 202 denotes an NMOS and numeral 203 denotes a PMOS. The NMOS 202 and the PMOS 203 are connected between the base and emitter of the PNP 201. Gates of the NMOS 202 and the PMOS 203 are coupled to control signals $C_1$ and $C_2$, respectively.

The operation of this circuit will now be described. Assuming now that the switching circuit 200 is in the active state, control signals represented as $C_1=0$ and $C_2=1$ are supplied to set both the NMOS 202 and the PMOS 203 at OFF condition. Therefore, the base current of the PNP 201 flows to the input $I_1$ and the PNP 201 is set at ON condition. On the other hand, when the switching circuit 200 is in the quiescent state, control signals represented as $C_1=1$ and $C_2=0$ are supplied to set both the NMOS 201 and the PMOS 203 at ON condition. At this time, therefore, the base and emitter of the PNP 201 are substantially at same potential. Even if the output $O_1$ changes from the "0" level to "1" level, a reverse bias is not applied between the base and the emitter. Further, a false base current generated at this time is supplied from the output $O_1$ via at least one of the NMOS 202 and the PMOS 203. It is thus prevented that the PNP 201 is set at ON condition to let flow a false collector current. It is important that both the NMOS and the PMOS set at either ON condition together or OFF condition together are provided between the base and emitter of the bipolar transistor as shown in the embodiments of FIGS. 1 and 2. When single connection of the NMOS or PMOS is used, it is not set at ON condition in some cases depending upon the potential condition of $I_1$ and $O_1$.

Figure 24:
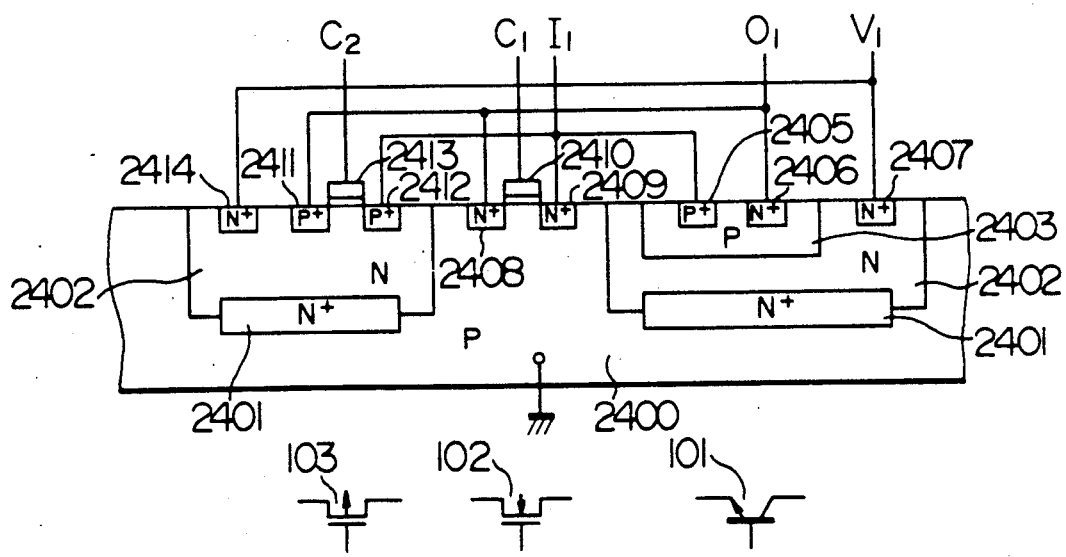
FIG. 24 is a sectional view of the switching circuit of FIG. 1.
Figure 26A:
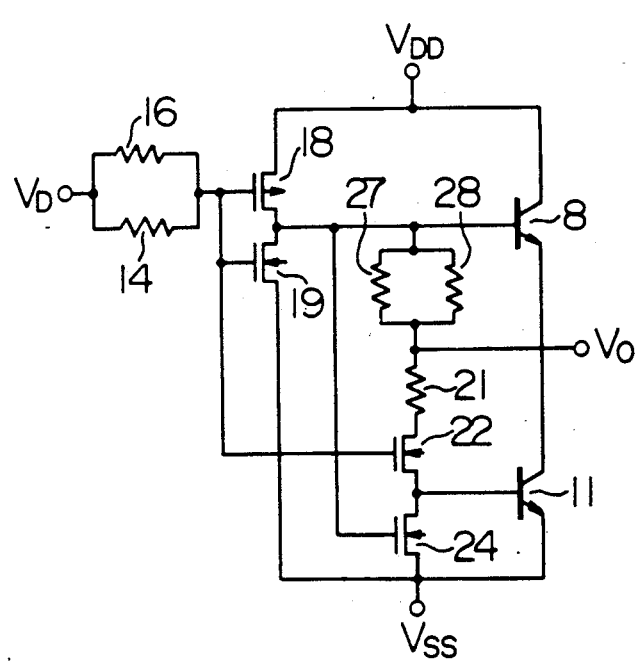
FIGS. 26A and 26B show equivalent circuits of the prior art circuit.
Figure 26B:
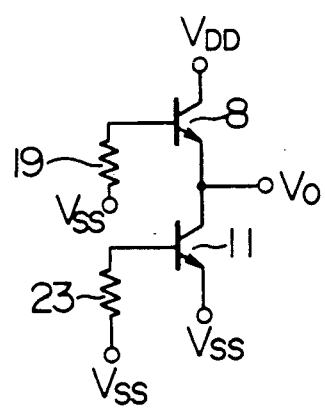

FIG. 24 shows a typical sectional structure of the switching circuit of FIG. 1 formed on a semiconductor substrate.

In FIG. 24, numeral 2400 denotes a P-type semiconductor substrate. The NPN 101 is so formed as to have an N-type island 2402 formed on the P-type substrate 2400 as the collector, a P-type region 2403 as the base, and an N+ region 2406 formed in the P-type region 2403 as the emitter. Further, the collector electrode and the base electrode are taken out from an N+ region 2407 and a P+ region 2405, respectively. The NMOS 102 is so formed as to have an N+ region 2408 formed on the P-type substrate 2400 as the source electrode, an N+ region 2409 formed on the P-type substrate 2400 as the drain electrode, and a polysilicon electrode 2410 as the gate electrode. The PMOS 103 is so formed as to have an N-type island 2402 formed on the P-type substrate 2400 as the PMOS substrate, a P+ region 2411 formed in the N-type island 2402 as the drain electrode, a P+ region 2412 formed in the N-type island 2402 as the source electrode, and a polysilicon electrode 2413 as the gate electrode.

FIG. 25 shows a typical sectional structure of the switching circuit of FIG. 2 formed on a semiconductor substrate.

In FIG. 25, numeral 2500 denotes a P-type semiconductor substrate. The PNP 201 is so formed as to have an N-type island 2502 formed on the P-type substrate 2500 as the base, a P+ region 2506 formed in the N-type island as the emitter electrode, a P+ region 2507 formed in the N-type island as the collector electrode. The base electrode is taken out from an N+ region 2505. Since the NMOS 202 and the PMOS 203 are formed in the same way as the description of FIG. 24, they will not be described.

Figure 3:
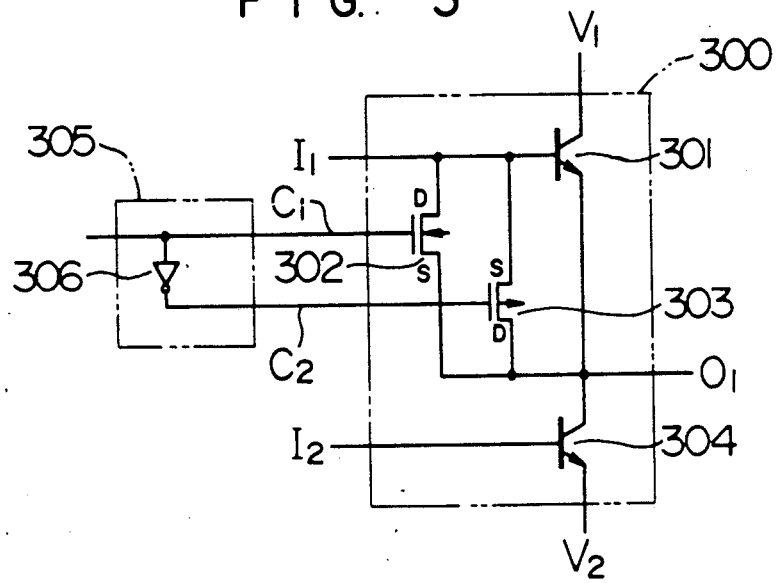

FIG. 3 shows a switching circuit 300 according to another embodiment of the present invention. In FIG. 3, an NPN 301 has a collector connected to a power source $V_1$, a base connected to an input $I_1$, and an emitter connected to an output $O_1$. An NPN 304 has a collector connected to the output $O_1$, a base connected to an input $I_2$, and an emitter connected to a power source $V_2$. An NMOS 302 has a drain connected to the base of the NPN 301, a source connected to the output $O_1$, and a gate coupled to a control signal $C_1$. A PMOS 303 has a source connected to the base of the NPN 301, a drain connected to the output $O_1$, and a gate coupled to a control signal $C_2$. Numeral 305 denotes a circuit similar to the circuit 104 of FIG. 1. The operation of the circuit shown in FIG. 3 will now be described.

Assuming now that the switching circuit 300 is in the active state, control signals represented as $C_1=0$ and $C_2=1$ are supplied to set both the NMOS 302 and the PMOS 303 at OFF condition. Further, the NPN 301 and the NPN 304 operate in a complementary way. Inputs $I_1$ and $I_2$ are so applied that one of the NPN 301 and the NPN 304 is at ON condition when the other of them is at OFF condition. When the input $I_1$ is energized, the NPN 304 is at OFF condition and the NPN 301 is set at ON condition, the output $O_1$ being switched to the "1" level. When the input $I_2$ is activated, the NPN 301 is at OFF condition, and the NPN 304 is set at ON condition, the output $O_1$ being switched to the "0" level.

When the switching circuit 300 is in the quiescent condition, control signals represented as $C_1=1$ and $C_2=0$ are supplied to the switching circuit to set the both the NMOS 302 and the PMOS 303 at ON condition. In the quiescent state, neither the input $I_1$ nor the input $I_2$ is activated. Even if the voltage level at $O_1$ is changed by the output of another circuit commonly connected to the output $O_1$, the base potential of the NPN 301 also changes so as to follow the change of the voltage level because both the NMOS 302 and the PMOS 303 are at the ON condition. At this time, therefore, reverse voltage is not applied between the base and the emitter of the NPN 301. Further, a false base current is generated by a change in base potential of the NPN 301. Since this current flows out to the output $O_1$ through the NMOS 302 and/or the PMOS 303, however, it is prevented the NPN 301 is improperly set at ON condition and an improper large current flows from the power source $V_1$.

Figure 4:
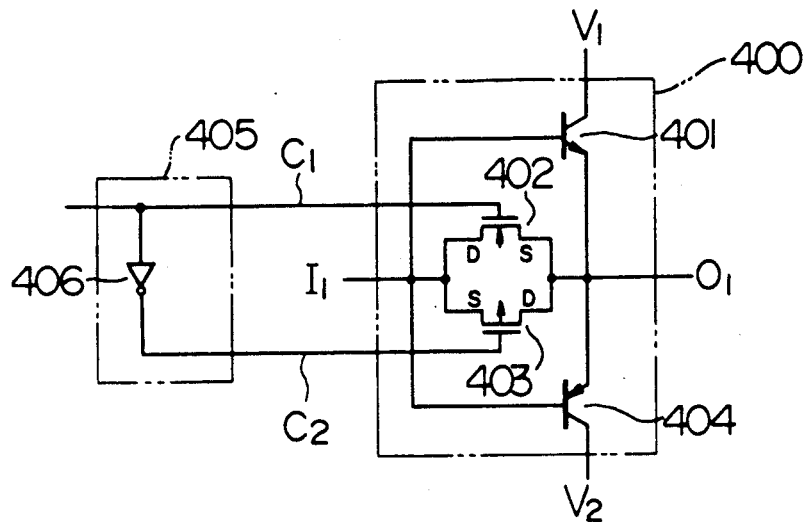

FIG. 4 shows a switching circuit 400 which is another embodiment of the present invention. In FIG. 4, an NPN 401 has a collector connected to a voltage source $V_1$, a base connected to an input $I_1$, and an emitter connected to an output $O_1$. A PNP 404 has an emitter connected to the output $O_1$, a base connected to the input $I_1$, and a collector connected to a power source $V_2$. Further, an NMOS 402 has a drain connected to the output $O_1$, a source connected to the input $I_1$, and a gate connected to a control signal $C_1$. A PMOS 403 has a source connected to the output $O_1$, a drain connected to the input, and a gate coupled to a control signal $C_2$. Numeral 405 denotes a circuit similar to the circuit 104 of FIG. 1. The operation of this circuit will now be described. Assuming now that the switching circuit 400 is in the active state, control signals represented as $C_1=1$ and $C_2=1$ are supplied to the switching circuit so as to set both the NMOS 402 and the PMOS 403 at OFF condition. The NPN 401 and the PNP 404 operate in a complementary way with respect to the input signal $I_1$. When $I_1$ is switched to a "1" level, the PNP 404 is set at OFF condition and the NPN 401 is set at ON condition, the output $O_1$ being set at the "1" level. On the contrary, when the input $I_1$ is switched to a "0" level, the NPN 401 is set at OFF condition and the PNP 404 is set at ON condition, the output $O_1$ being set at the "0" level.

On the other hand, when the switching circuit 400 is in the quiescent state, control signals represented as $C_1 = 1$ and $C_2 = 0$ are applied to the switching circuit to set both the NMOS 402 and the PMOS 403 at ON condition. Further, in the quiescent state, the input $I_1$ is not activated. Even if the voltage level of the output $O_1$ is changed by another circuit at this time, the voltage level of the input $I_1$ changes so as to follow the voltage change of the output $O_1$ because both the NMOS 402 and the PMOS 403 are at ON condition. At this time, a false base current is generated by a potential change of the input $I_1$. Since this current flows to the output $O_1$ through the NMOS 402 and/or PMOS 403, however, it is prevented that the NPN 401 and the PNP 404 are improperly set at ON condition and an improper large current flows from the power source $V_1$ or $V_2$.

Figure 5:
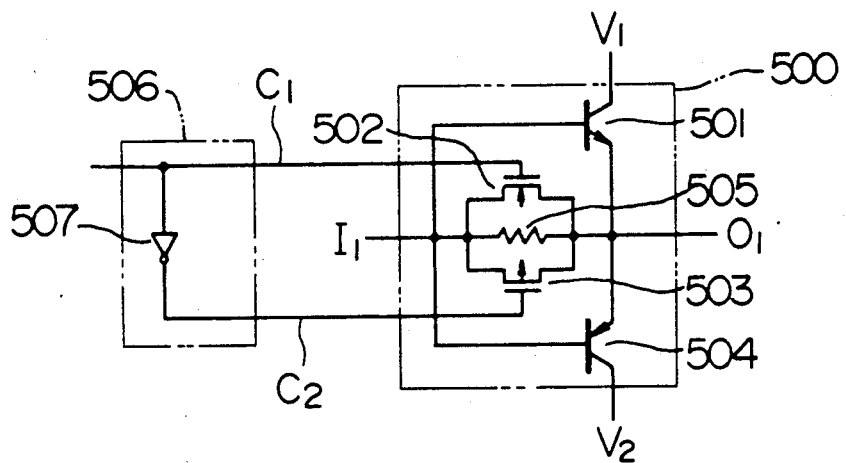

FIG. 5 includes a resistor 505 in addition to the embodiment of FIG. 4. Its basic operation is the same as that of the circuit of FIG. 4. The resistor 505 functions to compensate the lowering of amplitude of the output $O_1$ caused by voltage ($V_{BE}$) across the base-emitter junction of each of the NPN 501 and the PNP 504. Owing to the function of the resistor 505, it is possible to make the voltage level of the input $I_1$ equal to that of the output $O_1$.

Figure 6:
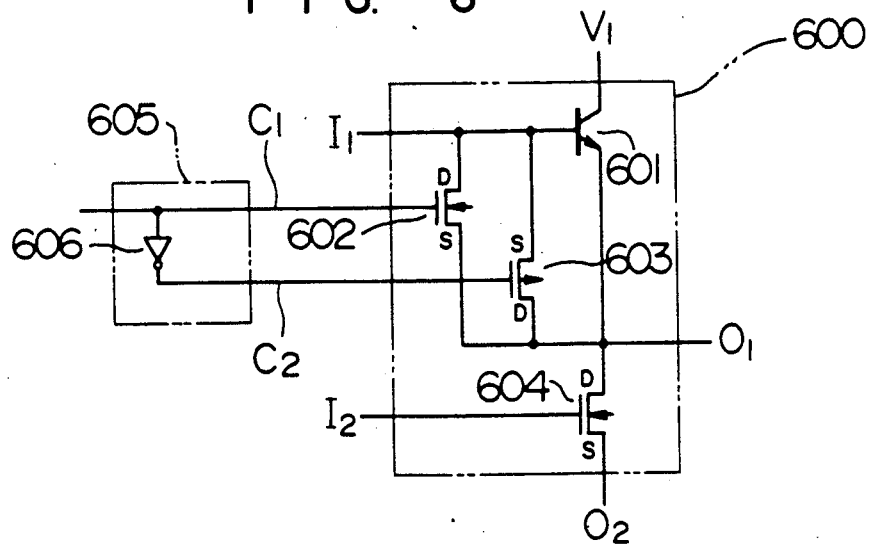

FIG. 6 shows a switching circuit 600 which is another embodiment of the present invention. In FIG. 6, an NPN 601 has a collector connected to a power source $V_1$, a base connected to an input $I_1$, and an emitter connected to an output $O_1$. An NMOS 604 has a drain connected to the output $O_1$, a gate connected to an input $I_2$, and a source connected to an output $O_2$. An NMOS 602 has a drain connected to the base of the NPN 601, a source connected to the output $O_1$, and a gate coupled to a control signal $C_1$. A PMOS 603 has a source connected to the base of the NPN 601, a drain connected to the output $O_2$, and a gate coupled to the control signal $C_2$. Numeral 605 denotes a circuit similar to the circuit 104 of FIG. 1. The operation of the circuit shown in FIG. 6 will now be described. When the switching circuit 600 is in the active state, control signals represented as $C_1 = 0$ and $C_2 = 1$ are applied to the switching circuit to set both the NMOS 602 and the PMOS 603 at OFF condition. The input signals $I_1$ and $I_2$ are supplied in a complementary way. When $I_1$ is switched to a "1" level, $I_2$ is switched to a "0" level. At this time, therefore, the NMOS 604 is set at OFF condition and the NPN 601 is set at ON condition, the output $O_1$ being set at the "1" level. On the contrary, when the input $I_1$ is switched to the "0" level, the input $I_2$ is switched to the "1" level. At this time, the NPN 601 is set at OFF condition, and the NMOS 604 is set at ON condition. If $O_2$ is at "0" level, the output $O_1$ is set at "0" level. The output $O_2$ is a terminal for logic expansion. When logic expansion is not performed, the output $O_2$ is connected to reference potential. When logic is expanded, the output $O_2$ is connected to the reference potential via another NMOS.

On the other hand, when the switching circuit 600 is in the quiescent state, control signals represented as $C_1 = 1$ and $C_2 = 0$ are supplied to the switching circuit to set both the NMOS 602 and the PMOS 603 at ON condition. Further, at this time, the input $I_1$ is not actuated, and the input $I_2$ is fixed at the "0" level. If the voltage level of the output $O_1$ changes under this state, the base potential of the NPN 601 also changes so as to follow it. At this time, therefore, reverse voltage is not applied between the base and emitter of the NPN 601. Further, a false base current generated at this time flows out to the output $O_1$ through the NMOS 602 and/or the PMOS 603. It is thus prevented that the NPN 601 is set at ON condition and an improper large current flows from the power source.

Figure 7:
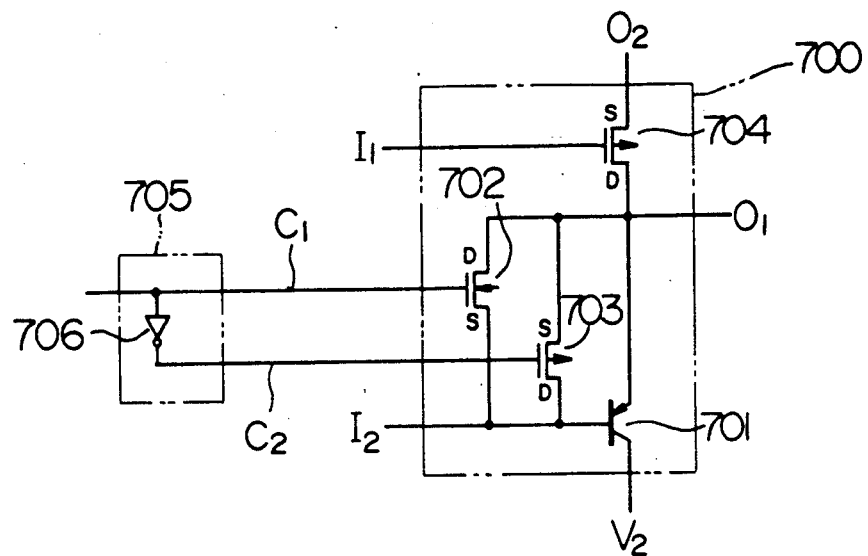

FIG. 7 shows a switching circuit 700 which is another embodiment of the present invention. In FIG. 7, a PMOS 704 has a source connected to a second output $O_2$, a drain connected to a first output $O_1$, and a gate connected to an input $I_1$. A PNP 701 has an emitter connected to the output $O_1$, a base connected to an input $I_2$, and a collector connected to a power source $V_2$. An NMOS 702 has a drain connected to the output $O_1$, a source connected to the base of the PNP 701, and a gate coupled to a control signal $C_1$. A PMOS 703 has a source connected to the output $O_1$, a drain connected to the base of the PNP 701, and a gate coupled to a control signal $C_2$. Numeral 705 denotes a circuit similar to the circuit 104 of FIG. 1. The operation of the circuit shown in FIG. 7 will now be described. Assuming now that the switching circuit 700 is in the active state, control signals represented as $C_1 = 0$ and $C_2 = 1$ are supplied to the switching circuit to set both the NMOS 702 and the PMOS 703 at OFF condition. The input signals $I_1$ and $I_2$ are supplied in a complementary way. When $I_1$ is switched to the "0" level, $I_2$ is switched to the "1" level. At this time, therefore, the PNP 701 is set at OFF condition and the NMOS 704 is set at ON condition, the output $O_1$ being set at the "1" level. On the contrary, when the input $I_1$ is switched to the "1" level, the input $I_2$ is switched to the "0" level. At this time, the PMOS 704 is set at OFF condition and the PNP 701 is set at ON condition, the output $O_1$ being set at the "0" level.

The output $O_2$ is a terminal for logic expansion. When logic expansion is not performed, the output $O_2$ is directly connected to the power source. When logic expansion is performed, the output $O_2$ is connected to the power source through another PMOS.

On the other hand, when the switching circuit 700 is in the quiescent state, control signals represented as $C_1 = 1$ and $C_2 = 0$ are supplied to the switching circuit to set both the NMOS 702 and the PMOS 703 at ON condition. Further, at this time, the input $I_1$ is fixed to the "1" level, and the input $I_2$ is not activated. If the voltage level of the output $O_1$ changes under this state, the base voltage of the PNP 701 also changes so as to follow it. At this time, therefore, a reverse bias is not applied between the base and emitter of the PNP 701. Further, a false base current generated at this time is supplied from the output $O_2$ through at least one of the NMOS 702 and the PMOS 703. It is thus prevented that the PNP 701 is improperly set at ON condition and an improper large current flows to the power source $V_2$.

Figure 8A:
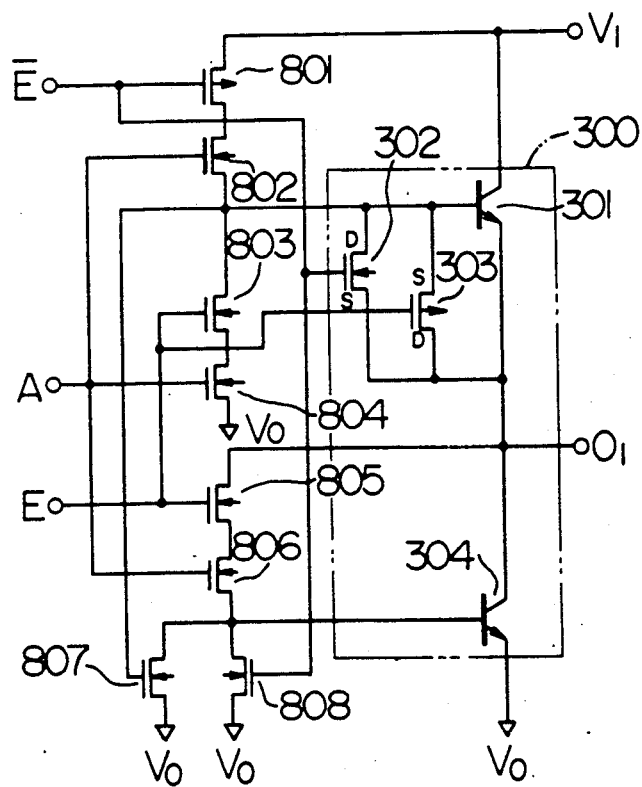
FIGS. 8A, 8B, 9A and 9B show embodiments of a tri-state inverter circuit according to the present invention.
Figure 8B:
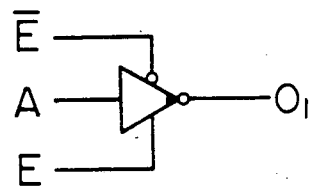

FIG. 8A shows a tri-state inverter which is an embodiment of the present invention. FIG. 8B shows a logic symbol of the inverter shown in FIG. 8A.

In FIG. 8A, a circuit 300 is the same as the switching circuit 300 shown in FIG. 3. A PMOS 801 and a PMOS 802 are connected in series between a power source $V_1$ and the base of an NPN 301. Gates of the PMOS 801 and the PMOS 802 are coupled to a tri-state control signal $\overline{E}$ and an input signal A, respectively. An NMOS 803 and an NMOS 804 are connected in series between the base of the NPN 301 and reference potential $V_O$. Gates of the NMOS 803 and NMOS 804 are coupled to a tri-state control signal E and the input signal, respectively. An NMOS 805 and an NMOS 806 are connected in series between an output $O_1$ and the base of an NPN 304. Gates of the NMOS 805 and NMOS 806 are coupled to the tri-state control signal E and the input signal A, respectively. An NMOS 807 and an NMOS 808 have drains connected to the base of the NPN 304 and sources connected to reference potential $V_O$. Gates of the NMOS 807 and the NMOS 808 are coupled to the base of the NPN 301 and the tri-state control signal $\overline{E}$. The tri-state control signals E and $\overline{E}$ are complementary each other, and are generated in a circuit similar to the circuit 104 of FIG. 1.

Further, gates of the NMOS 302 and PMOS 303 are coupled to the tri-state control signals $\overline{E}$ and E.

The operation of the active state of the circuit shown in FIG. 8A will now be described. The tri-state control signals in the active state are represented as $\overline{E}=0$ and $E=1$. At this time, therefore, the NMOS 302, PMOS 303 and NMOS 808 are at OFF condition, whereas the PMOS 801 and NMOS 805 are at ON condition. When the input signal A is switched from the "0" level to the "1" level under this state, the PMOS 802 is set at OFF condition, and the NMOS 804 and the NMOS 806 are set at ON condition.

At this time, therefore, a base current path extending from the power source $V_1$ to the NPN 301 through the PMOS 801 and PMOS 802 is interrupted. Since the NMOS 803 and NMOS 804 are set at ON condition, the base of the NPN 301 is fixed to reference potential, and hence the NPN 301 is set at OFF condition. On the other hand, the NMOS 807 and NMOS 808 are set at OFF condition, whereas the NMOS 805 and NMOS 806 are set at ON condition. Therefore, a base current of the NPN 304 is supplied from the output $O_1$ through the NMOS 805 and the NMOS 806, the NPN 304 being set at ON condition. As a result, the output $O_1$ is switched to the "0" level.

When the input signal A is switched from the "1" level to the "0" level, the PMOS 802 and the NMOS 807 are set at ON condition, and the NMOS 806 is set at OFF condition.

At this time, therefore, a base current path extending from the output $O_1$ to the base of the NPN 304 through the NMOS 805 and the NMOS 806 is interrupted. Further, the NMOS 807 is set at ON condition. Therefore, the base of the NPN 304 is fixed to the reference potential, and the NPN 304 is set at OFF condition.

On the other hand, the NMOS 804 is at OFF condition, and the PMOS 801 and the PMOS 802 are set at ON condition. Therefore, a base current is supplied from the power source $V_1$ to the NPN 301 through the PMOS 801 and the PMOS 802, the NPN 301 being set at ON condition. As a result, the output $O_1$ is switched to the "1" level.

The operation of this circuit in the quiescent state will now be described. The tri-state control signals in the quiescent state can be represented as $\overline{E}=1$ and $E=0$. At this time, therefore, the PMOS 801, the NMOS 803 and the NMOS 805 are set at OFF condition whereas the NMOS 302 and the NMOS 808 are set at ON condition.

Therefore, the base current path of the NPN 304 is interrupted. In addition, the base potential is fixed to the reference potential by the operation of the NMOS 808. Accordingly, the NPN 304 is completely set at OFF condition. Further, the base current path of the NPN 301 is interrupted, and the path extending from the base of the NPN 301 to the reference potential through the NMOS 803 and the NMOS 804 is also interrupted. As a result, the NPN 301 is set at OFF condition.

On the other hand, the base and emitter of the NPN 301 are kept substantially at same potential because the NMOS 302 and the PMOS 303 are at ON condition. However the voltage level of the output $O_1$ may change, therefore, reverse voltage is not applied between the base and emitter of the NPN 301. A false base current is generated because the base potential of the NPN 301 changes so as to follow the output $O_1$. Since this current flows out to the output $O_1$ through the NMOS 302 and/or the PMOS 303, it is prevented that the NPN 301 is improperly set at ON condition and a large improper current flows from the power source $V_1$.

Figure 9A:
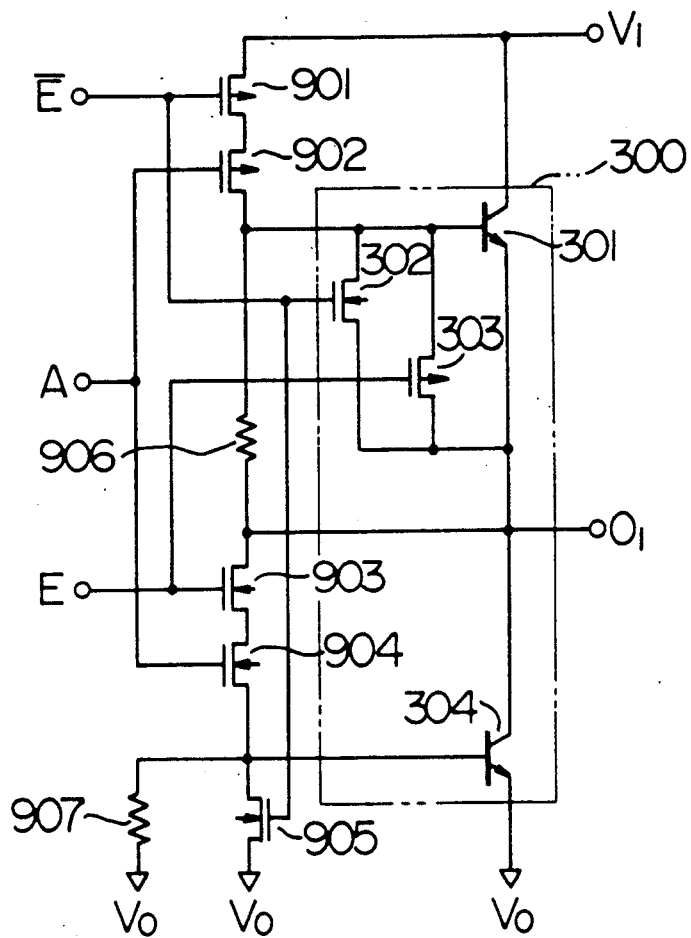
Figure 9B:
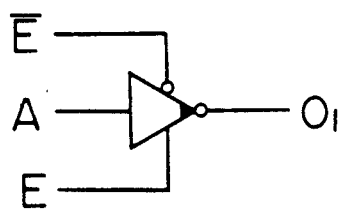

FIG. 9A shows a tri-state inverter which is an embodiment of the present invention. FIG. 9B shows the logic symbol of the inverter shown in FIG. 9A.

In FIG. 9A, a circuit 300 is the same as the switching circuit shown in FIG. 3. A PMOS 901 and a PMOS 902 are connected in series between a power source $V_1$ and the base of an NPN 301. Gates of the PMOS 901 and PMOS 902 are coupled to a tri-state control signal $\overline{E}$ and an input signal A. An NMOS 903 and an NMOS 904 are connected in series between an output $O_1$ and the base of an NPN 304. Gates of the NMOS 903 and the NMOS 904 are connected to a tri-state control signal E and the input signal, respectively. An NMOS 905 has a drain connected to the base of the NPN 304, a source connected to reference potential $V_O$, and a gate connected to the tri-state control signal $\overline{E}$. A resistor 906 is connected between the base of the NPN 301 and the output $O_1$. A resistor 907 is connected between the base of the NPN 304 and the reference potential.

Gates of the NMOS 302 and the PMOS 303 are connected to the tri-state control signals $\overline{E}$ and E. The operation of this circuit in the active state will now be described. The tri-state signals in the active state can be represented as $\overline{E}=0$ and $E=1$. At this time, therefore, the NMOS 302, NMOS 905 and PMOS 303 are at OFF condition, whereas the PMOS 901 and NMOS 903 are at ON condition. When the input signal A is switched from the "0" level to the "1" level under this state, the PMOS 901 is set at OFF condition and the NMOS 904 is set at ON condition.

At this time, therefore, a base current path extending from the power source $V_1$ to the NPN 301 through the PMOS 901 and the PMOS 902 is interrupted, the NPN 301 being set at OFF condition. On the other hand, since the NMOS 903 and NMOS 904 are set at ON condition, a base current of the NPN 304 is supplied from the output $O_1$ through the NMOS 903 and NMOS 904, the NPN 304 being set at ON condition. As a result, the output $O_1$ is switched to the "0" level. At this time, the resistor 906 functions as means for discharging the electric charge stored in the base of the NPN 301. Further, the resistor 907 functions as pull-down means for pulling down the "0" level voltage of the output $O_1$ to the reference potential.

When the input signal A is switched from the "1" level to the "0" level, the PMOS 902 is set at ON condition and the NMOS 904 is set at OFF condition. At this time, therefore, a base current path extending from the output $O_1$ to the NPN 304 through the NMOS 903 and the NMOS 904 is interrupted, and hence the NPN 304 is set at OFF condition.

On the other hand, since the PMOS 901 and the PMOS 902 are set at ON condition, a base current flows from the power source $V_1$ to the NPN 301 through the PMOS 901 and the PMOS 902, the NPN 301 being set at ON condition. As a result, the output $O_1$ is switched to the "1" level. At this time, the resistor 907 functions as discharge means for the electric charge stored in the base of the NPN 304, and the resistor 906 functions as pull-up means for pulling up the voltage of the "1" level of the output $O_1$ up to the power source $V_1$.

The operation of this circuit in the quiescent state will now be described. Tri-state control signals in the quiescent state can be represented as $\bar{E}=1$ and $E=0$. At this time, therefore, the PMOS 901 and the NMOS 903 are set at OFF condition, whereas the PMOS 303, the NMOS 302 and the NMOS 905 are set at ON condition. Therefore, the base current path for the NPN 304 is interrupted. In addition, the base potential is fixed to the reference potential by the function of the NMOS 905 and the resistor 907. As a result, the NPN 304 is completely set at OFF condition. Further, the base current path of the NPN 301 is also interrupted, and hence the NPN 301 is also set at OFF condition. On the other hand, since the NMOS 302 and the PMOS 303 are at ON condition, the base and the emitter of the NPN 301 are kept substantially at same potential. However the voltage level of the output $O_1$ may change, therefore, reverse voltage is not applied between the base and the emitter of the NPN 301. Since the base potential of the NPN 301 changes so as to follow the output $O_1$, a false base current is generated. Since this current flows out to the output $O_1$ through the NMOS 302 and/or the PMOS 303, however, it is prevented that the NPN 301 is improperly set at ON condition and a large improper current flows from the voltage source $V_1$.

Figure 10A:
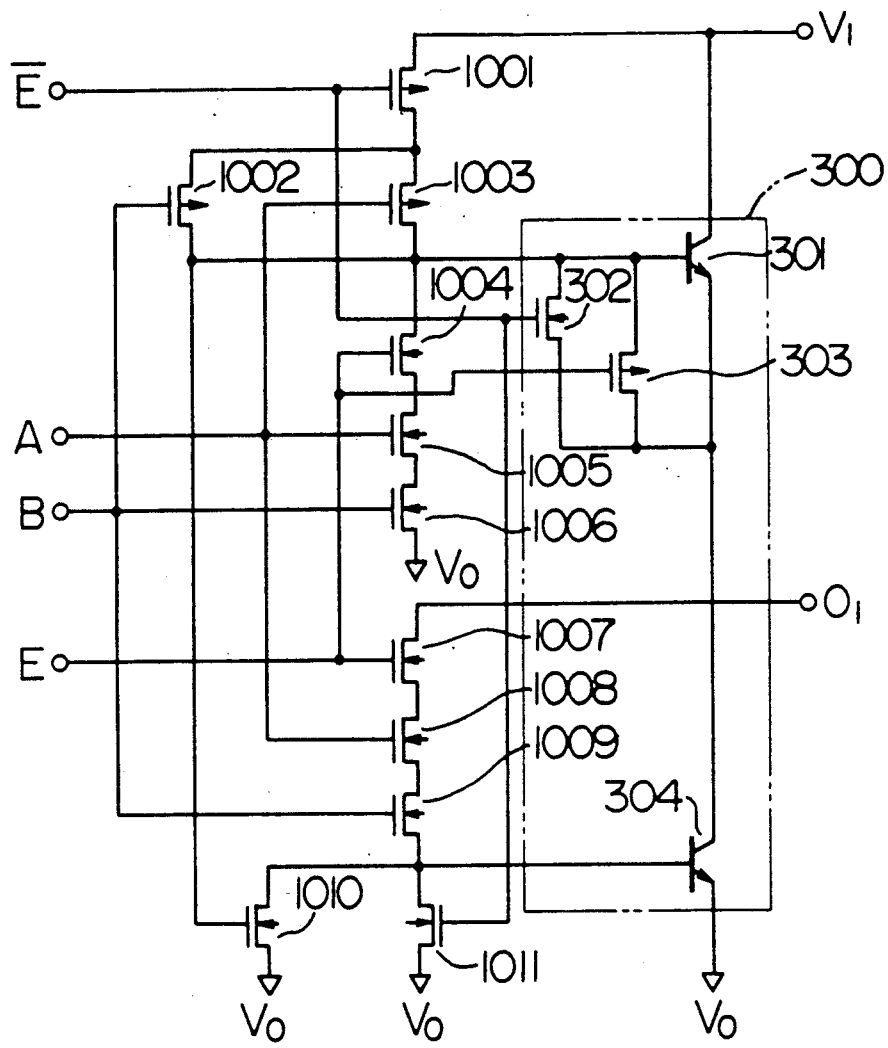
FIGS. 10A and 10B show an embodiment of a tri-state 2-input NAND circuit according to the present invention.
Figure 10B:
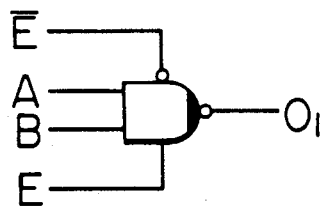

FIGS. 10A and 10B show a tri-state 2-input NAND gate which is an embodiment of the present invention and its logic symbol, respectively. In the present embodiment, the number of inputs of the tri-state inverter shown in FIG. 8A is expanded to form a tri-state 2-input NAND gate. Excepting that the gate of FIG. 10A acts as a 2-input NAND gate in the active state, it is equivalent to the circuit of FIG. 8A inclusive of the operation in the nonactive state. Since it is easy for those skilled in the art to understand the configuration and operation, detailed description will be omitted. Further, multi-input NAND gates (such as 3-input or 4-input NAND gates) other than 2-input NAND gates can be formed by increasing the number of parallel or serial MOS transistors having gates connected to the inputs A and B and connecting those gates to respective inputs.

Further, multi-input NOR gates can be formed by changing parallel connection of the MOS transistors having gates connected to the inputs to serial connection and vice versa.

Figure 11A:
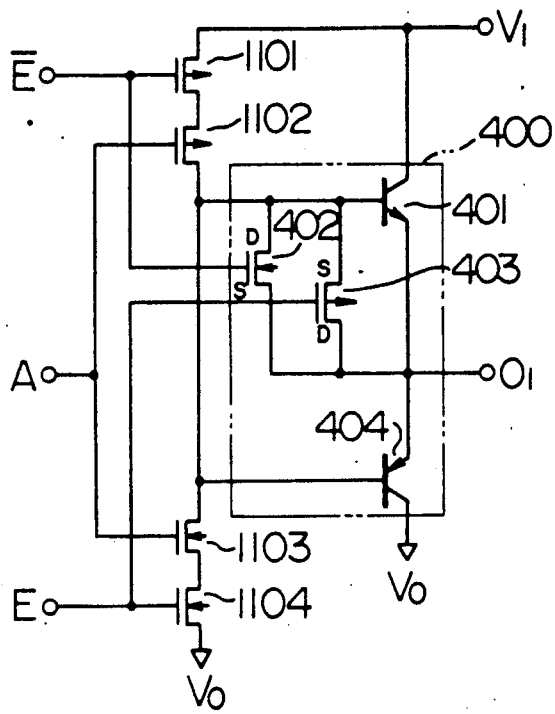
FIGS. 11A, 11B, 12A and 12B show embodiments of the tri-state inverter circuit according to the present invention.
Figure 11B:
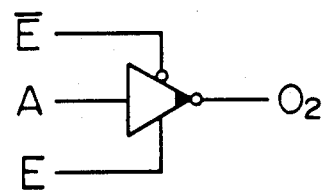

FIGS. 11A and 11B show a tri-state inverter which is an embodiment of the present invention and its logic symbol, respectively. In FIG. 11A, numeral 400 denotes the same circuit as the switching circuit of FIG. 4. A PMOS 1101 and a PMOS 1102 are connected in series between a power source $V_1$ and the base of the NPN 401. Gates of the PMOS 1101 and the PMOS 1102 are connected to a tri-state control signal $\bar{E}$ and an input signal A. An NPN 1103 and an NPN 1104 are connected in series between the base of the PNP 404 and reference potential $V_O$. Gates of the NPN 1103 and the NPN 1104 are connected to the input signal A and the tri-state control signal E. Further, gates of the NMOS 402 and the PMOS 403 are connected to the tri-state control signals $\bar{E}$ and E, respectively.

The operation of this circuit in the active state will now be described. The tri-state control signals in the active state are represented as $\bar{E}=0$ and $E=1$. At this time, therefore, the PMOS 1101 and the NMOS 1104 are set at ON condition, and the NMOS 402 and the PMOS 403 are at OFF condition. When the input signal A is switched from a "0" level to a "1" level under this state, the PMOS 1102 is set at OFF condition and the NMOS 1103 is set at ON condition. Therefore, the NPN 401 is set at OFF condition, and the PNP 404 is set at ON condition. As a result, the output $O_1$ is switched to the "0" level. When the input signal A is switched from the "1" level to the "0" level, the NMOS 1103 is set at OFF condition, and the PMOS 1102 is set at ON condition. Therefore, the PNP 404 is set at OFF condition, and the NPN 401 is set at ON condition. As a result, the output $O_1$ is switched to the "1" level.

The operation of this circuit in the quiescent state will now be described. The tri-state control signals in the quiescent state can be represented as $\bar{E}=1$ and $E=0$. At this time, therefore, the PMOS 1101 and the NMOS 1104 are set at OFF condition, and the NPN 401 and the PNP 404 are also set at OFF condition. Since the NMOS 402 and the PMOS 403 are at ON condition, the base and the emitter of the NPN 401 and the base and the emitter of the PNP 404 are kept substantially at same potential. However the voltage level of the output $O_1$ may change, therefore, reverse voltage is not applied between the base and the emitter of the NPN 401 and between the base and the emitter of the PNP 404. Since the base voltage of the NPN 401 and the PNP 404 follows the output $O_1$, a false base current is generated. Since this current flows out to the output $O_1$ or flows in from the output $O_1$ through the NMOS 402 and/or the PMOS 403, however, it is prevented that the NPN 401 or the PNP 403 is improperly set at ON condition and a large improper current flows to the power source $V_1$ or the reference potential.

Figure 12A:
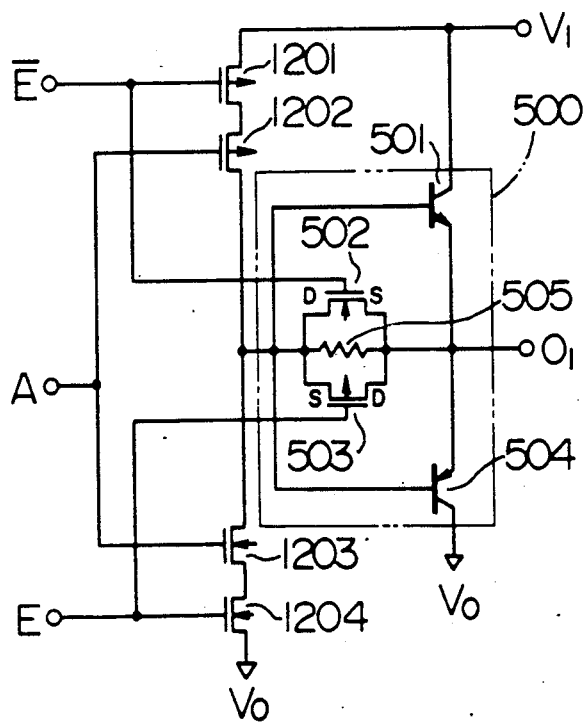
Figure 12B:
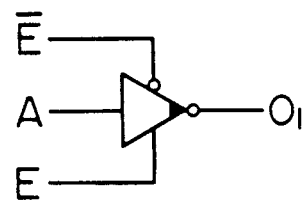

FIGS. 12A and 12B show a tri-state inverter which is another embodiment of the present invention and its logic symbol, respectively. This circuit has the same configuration as that of the embodiment shown in FIG. 11 with the exception of a resistor 505. The logic operation of this circuit is the same as the embodiment shown in FIG. 11. The resistor 505 is connected in parallel with the NMOS 502 and the PMOS 503. When the tri-state control signals are $\bar{E}=0$ and $E=1$ and the input signal A is at the "1" level, the resistor 505 functions as pull-down means for pulling down the voltage level of the output $O_1$ to the reference potential $V_O$. When the input signal A is at the "0" level, the resistor 505 functions as pull-up means for pulling up the voltage level of the output $O_1$ to the power source $V_1$.

FIGS. 13A and 13B show a tri-state 2-input NAND gate which is an embodiment of the present invention and its logic symbol, respectively. In the present embodiment, the number of inputs of the tri-state inverter shown in FIG. 11A is expanded to form a tri-state 2-input NAND gate. Excepting that the gate of FIG. 13A acts as a 2-input NAND gate in the active state, it is equivalent to the circuit of FIG. 11A inclusive of the operation in the nonactive state. Since it is easy for those skilled in the art to understand the configuration and operation, detailed description will be omitted. Since realization of multi-input gates other than 2-input NAND gates is also self-evident to those skilled in the art, presentation of new drawings will be omitted.

FIGS. 14A and 14B show a tri-state inverter which is another embodiment of the present invention and its logic symbol. In FIG. 14A, numeral 600 denotes the same circuit as the switching circuit shown in FIG. 6. A PMOS 1401 and a PMOS 1402 are connected in series between the power source and the base of the NPN 601. Gates of the PMOS 1401 and the PMOS 1402 are connected to a tri-state control signal $\overline{E}$ and an input signal A. An NMOS 1403 and an NMOS 1404 are connected in series between the base of the NPN 601 and reference potential $V_O$. Gates of the NMOS 1403 and the NMOS 1404 are connected to the input signal A and the tri-state control signal E, respectively. Further, an NMOS 1405 has a drain connected to the source of the NMOS 604, a source connected to the reference potential, and a gate coupled to the tri-state control signal E. The operation of this circuit in the active state will now be described. The tri-state control signals in the active state are represented as $\overline{E}=0$ and $E=1$. At this time, therefore, the PMOS 1401, the NMOS 1404 and the NMOS 1405 are at ON condition, whereas the NMOS 602 and the PMOS 603 are at OFF condition. When the input signal A is switched from the "0" level to the "1" level under this state, the PMOS 1402 is set at OFF condition, and the NMOS 1403 and the NMOS 604 are set at ON condition. Therefore, the base current path extending from the power source $V_1$ to the base of the NPN 601 through the PMOS 1401 and the PMOS 1402 is interrupted. In addition, the NMOS 1403 and the NMOS 1404 are at ON condition. Therefore, the voltage at the base of the NPN 601 is pulled down to the reference potential level, the NPN 601 being set at OFF condition. On the other hand, the output $O_1$ is switched to the "0" level because the NMOS 604 and the NMOS 1405 are at ON condition. When the input signal A is switched from the "1" level to the "0" level, the NMOS 1403 and the NMOS 604 are set at OFF condition, whereas the PMOS 1402 is set at ON condition. As a result, the output $O_1$ is switched to the "1" level.

The operation of this circuit in the quiescent state will now be described. The tri-state control signals in the quiescent state are represented as $\overline{E}=1$ and $E=0$. At this time, therefore, the PMOS 1401, the NMOS 1404 and the NMOS 1405 are set at OFF condition, and the NPN 601 is also at OFF condition. Since the NMOS 602 and the PMOS 603 are at ON condition, the base and the emitter of the NPN 601 are kept substantially at same potential. However the voltage level of the output $O_1$ may change, reverse voltage is not applied between the base and the emitter of the NPN 601.

Since the base potential of the NPN 601 changes so as to follow the output $O_1$, a false base current is generated. Since this current flows out to the output $O_1$ through the NMOS 602 and/or the PMOS 603, however, it is prevented that the NPN 601 is improperly set at ON condition and a large improper current flows from the power source $V_1$.

Figure 15A:
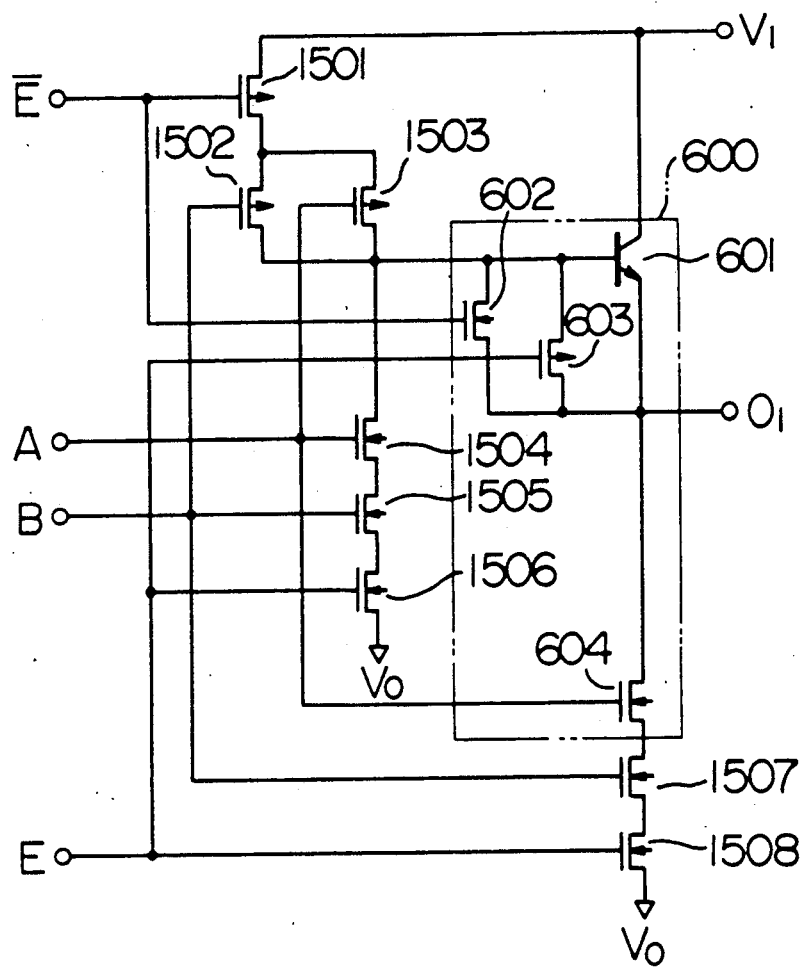
FIGS. 15A and 15B show an embodiment of the tri-state 2-input NAND circuit according to the present invention.
Figure 15B:
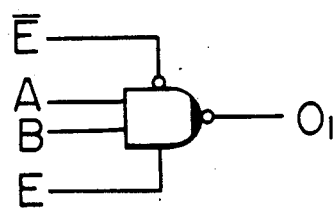

FIGS. 15A and 15B show a tri-state 2-input NAND gate which is an embodiment of the present invention and its logic symbol.

In the present embodiment, the number of inputs of the tri-state inverter shown in FIG. 14A is expanded to form a tri-state 2-input NAND gate. Excepting that the gate of FIG. 14A acts as a 2-input NAND gate in the active state, it is equivalent to the circuit of FIG. 14A inclusive of the operation in the nonactive state. Since it is easy for those skilled in the art to understand the configuration and operation, detailed description will be omitted. Since realization of multi-input gates such as NOR gates other than 2-input NAND gates is also self-evident to those skilled in the art, presentation of new drawings will be omitted.

Figure 16A:
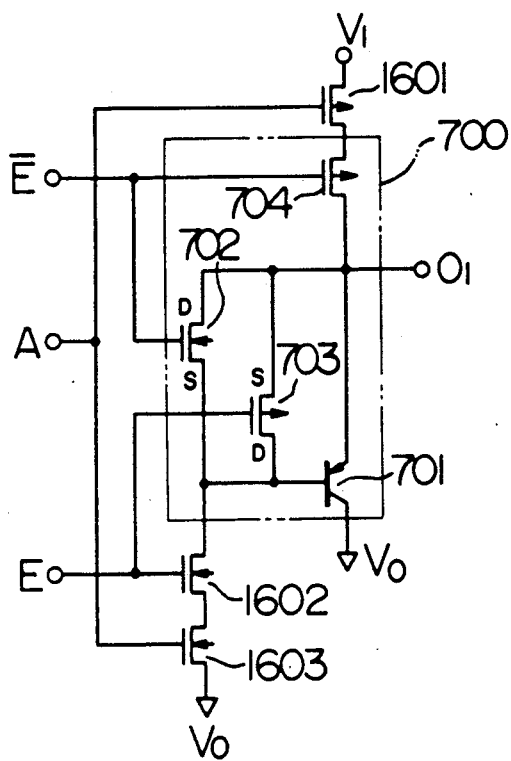
FIGS. 16A and 16B show an embodiment of the tri-state inverter circuit according to the present invention.
Figure 16B:
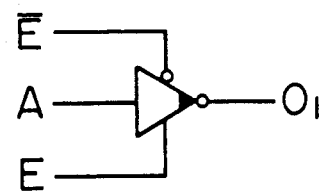

FIGS. 16A and 16B show a tri-state inverter which is an embodiment of the present invention and its logic symbol, respectively. In FIG. 16A numeral 700 denotes a circuit which is the same as the switching circuit shown in FIG. 7. A PMOS 1601 has a source connected to the power source $V_1$, a drain connected to the source of the PMOS 704, and a gate connected to the input signal A. An NMOS 1602 and an NMOS 1603 are connected in series between the base of the PNP 701 and the reference potential $V_O$. Gates of the NMOS 1602 and the NMOS 1603 are connected to the tri-state control signal E and the input signal A, respectively. Further, gates of the NMOS 702 and the PMOS 703 are coupled to the tri-state control signals $\overline{E}$ and E, respectively.

The operation of this circuit in the quiescent state will now be described. Tri-state control signals in the quiescent state are represented as $\overline{E}=0$ and $E=1$. At this time, therefore, the PMOS 704 and the NMOS 1602 are at ON condition, and the NMOS 702 and the PMOS 703 are at OFF condition.

When the input signal A is switched from the "0" level to the "1" level under this state, the PMOS 1601 is set at OFF condition and the NMOS 1603 is set at ON condition. Therefore, the PNP 701 is set at ON condition, and the output $O_1$ is switched to the "0" level. When the input signal A is switched from the "1" level to the "0" level, the NMOS 1603 is set at OFF condition and the PNP 701 is set at OFF condition. On the other hand, the output $O_1$ is switched to the "1" level because the PMOS 1601 is set at ON condition.

The operation of this circuit in the nonactive state will now be described. The tri-state control signals in the nonactive state are represented as $\overline{E}=1$ and $E=0$. At this time, therefore, the PMOS 704 and the NMOS 1602 are set at OFF condition, and the PNP 701 is also set at OFF condition. On the other hand, the base and the emitter of the PNP 701 are kept substantially at same potential because the NMOS 702 and the PMOS 703 are at ON condition. However the voltage level of the output $O_1$ may change, therefore, reverse voltage is not applied between the base and the emitter of the PNP 701. Further, a false base current is generated because the base potential of the PNP 701 changes so as to follow the output $O_1$. Since this current is supplied from the output $O_1$ through the NMOS 702 and/or the PMOS 703, however, it is prevented that the PMOS 701 is improperly set at ON condition and a large improper current flows to the reference potential through the PNP 701.

Figure 17A:
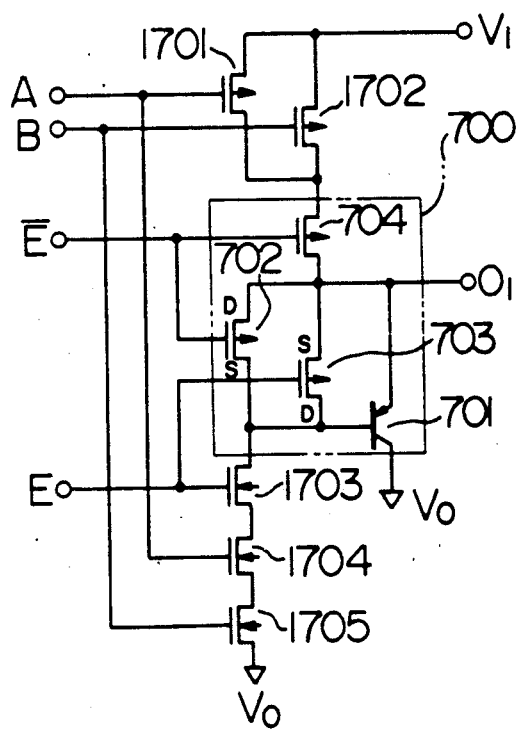
FIGS. 17A and 17B show an embodiment of the tri-state 2-input NAND circuit according to the present invention.
Figure 17B:
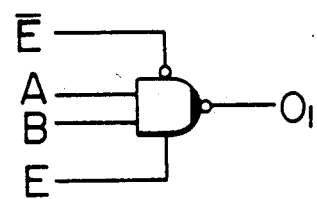

FIG. 17A shows a tri-state 2-input NAND gate circuit which is an embodiment of the present invention. FIG. 17B shows its logic symbol. In the present embodiment, the number of inputs of the tri-state inverter shown in FIG. 16A is expanded to form a tri-state 2-input NAND gate. Excepting that the gate of FIG. 17A acts as a 2-input NAND gate in the active state, it is equivalent to the circuit of FIG. 14A inclusive of the operation in the nonactive state. Since it is easy for those skilled in the art to understand the configuration and operation, detailed description will be omitted. Since realization of multi-input gates such as NOR gates other than 2-input NAND gates is also self-evident to those skilled in the art, presentation of new drawings will be omitted.

Figure 18:
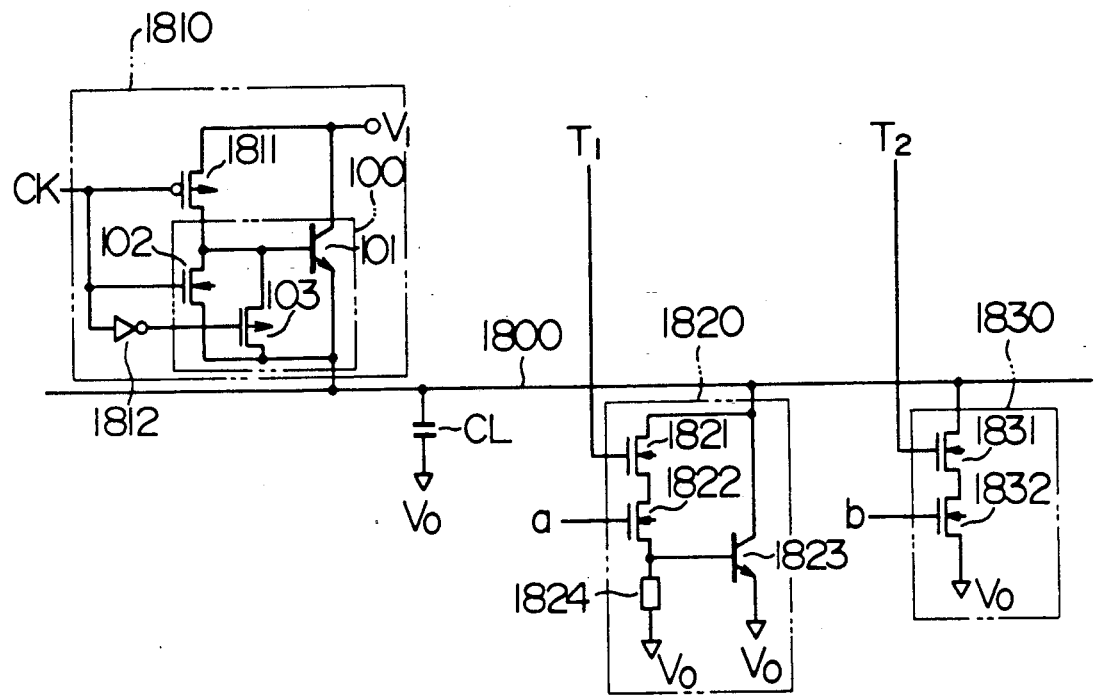
FIG. 18 shows an embodiment of a dynamic bus system according to the present invention.

FIG. 18 shows an embodiment of a dynamic bus of precharge type according to the present invention.

In FIG. 18, numeral 1800 denotes a dynamic bus of precharge type, and numeral 1810 denotes a precharge circuit for presetting the bus 1800 at the "1" level of the original state. Numerals 1820 and 1830 denote bus drivers for outputting results of predetermined logic operation to the bus 1800 in the nonactive period of the precharge circuit 1810 under the control of control signals $T_1$ and $T_2$, respectively.

In the bus precharge circuit 1810, numeral 100 denotes the same circuit as the switching circuit shown in FIG. 1. A PMOS 1811 has a source connected to the power source, a drain connected to the base of the NPN 101, and a gate connected to a precharge control signal CK. Gates of the NMOS 102 and the PMOS 103 are coupled to the precharge control signal CK and a signal obtained by inverting the CK in an inverter 1812, respectively. Further, the emitter of the NPN 101 is connected to the bus 1800.

The operation of the bus precharge circuit 1810 will now be described. When the bus is precharged, the control signal is CK=0. At this time, therefore, the PMOS 1811 is set at ON condition, and the NMOS 102 and the PMOS 103 are set at OFF condition. As a result, a base current is supplied from the PMOS 1811 to the NPN 101 to set the NPN 101 at ON condition. The bus 1800 is thus precharged to the "1" level. In FIG. 18, $C_L$ denotes a capacitive load coupled to the bus 1800.

When the precharge control signal CK is set at "1" level, the precharge circuit 1810 assumes the nonactive state. At this time, the PMOS 1811 is set at OFF condition, and the NPN 101 is also set at OFF condition. Further, the NMOS 102 and the PMOS 103 are set at ON condition. The base and the emitter of the NPN 101 are thus kept substantially at same potential.

The bus driver 1820 comprises an NPN 1823 having a collector connected to the bus 1800 and an emitter connected to the reference potential, an NMOS 1821 and an NMOS 1822 connected in series between the collector and the emitter of the NPN 1823 and respectively having gates respectively connected to a bus output control signal $T_1$ and an output data signal a, and discharge means 1824 for base charge connected between the base of the NPN 1823 and the reference potential.

When the signal $T_1$ is at the "1" level and the output data signal a is at the "1" level, the NMOS 1821, the NMOS 1822 and the NPN 1823 are set at ON condition, and the bus 1800 is switched to the "0" level. On the other hand, the NPN 1823 is at OFF condition when a is at the "0" level. Therefore, the bus 1800 is kept at the "1" level.

The other bus driver 1830 comprises an NMOS 1831 and an NMOS 1832 connected in series between the bus 1800 and the reference potential $V_O$ and respectively having gates respectively coupled to a bus output control signal $T_2$ and a data output signal b.

Assuming now that the signal $T_2$ is at the "1" level and the output data signal b is at the "1" level, the NMOS 1831 and the NMOS 1832 are set at ON condition, and the bus 1800 is switched to the "0" level. On the other hand, when b is at the "0" level, the bus 1800 is kept at the "1" level because the NMOS 1832 is at OFF condition.

When the bus 1800 is switched to the "0" level by either the bus driver 1820 or the bus driver 1830 under the condition that the precharge circuit 1810 is nonactive, the base potential of the NPN 101 changes so as to follow the potential change of the bus. A false base current generated by the change of the base potential flows out to the bus 1800 through the NMOS 102 and/or the PMOS 103. Therefore, it is prevented that the NPN 101 is improperly set at ON condition by the false base current and a large improper current flows from the power source $V_1$. Further, the base potential of the NPN 101 changes so as to follow the potential of the bus 1800 when the precharge circuit 1810 is in the nonactive state. Therefore, reverse voltage is not applied between the base and the emitter of the NPN 101.

Figure 19:
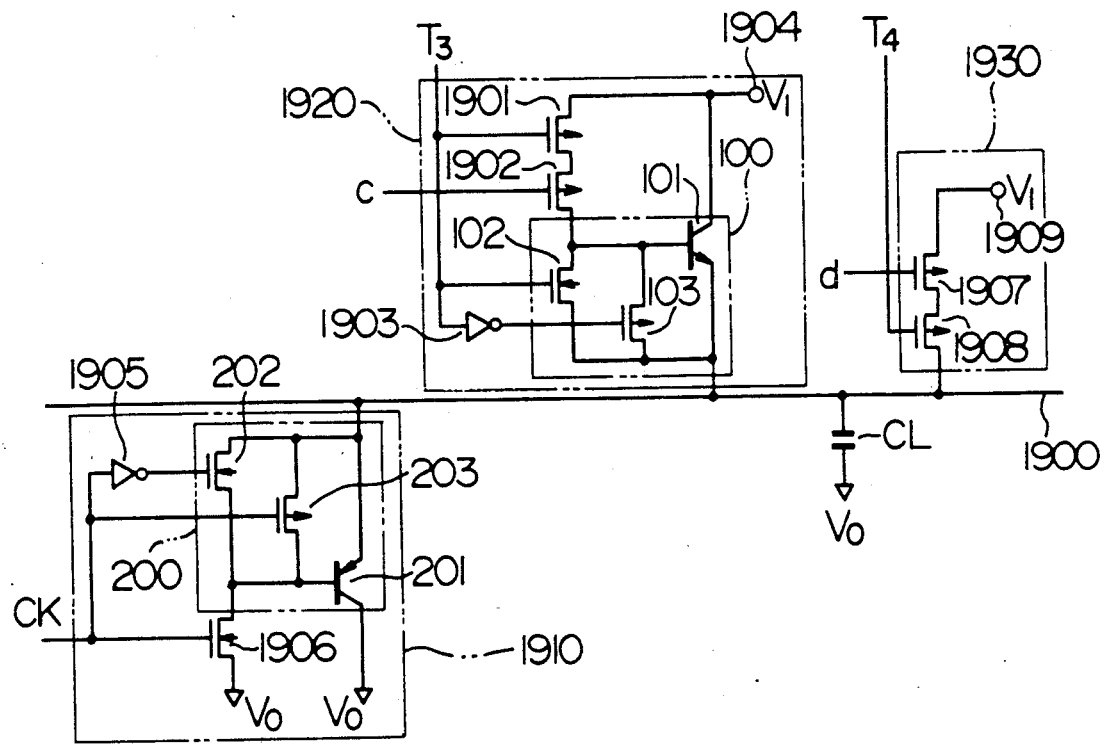
FIG. 19 shows another embodiment of the dynamic bus system according to the present invention.
Figure 22:
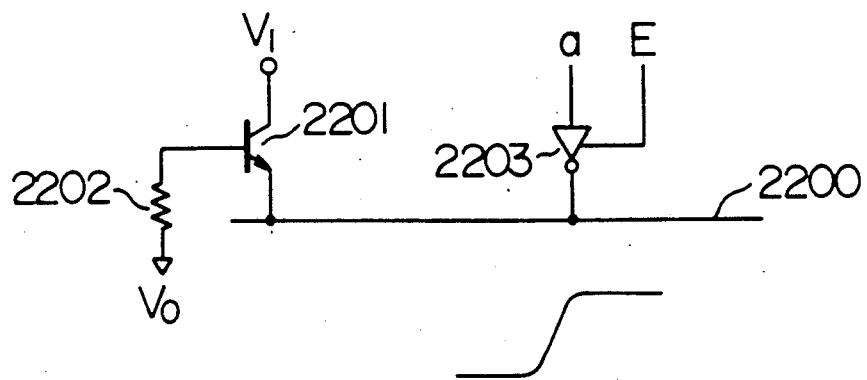
FIG. 22 shows a bus drive circuit.
Figure 23A:
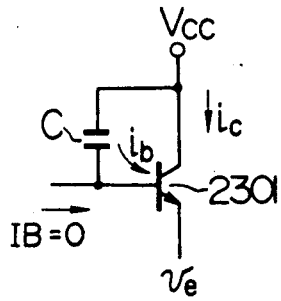
FIGS. 23A, 23B, 23C and 23D show false base currents of bipolar transistors.
Figure 23B:
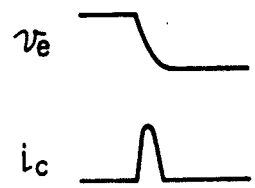
Figure 23C:
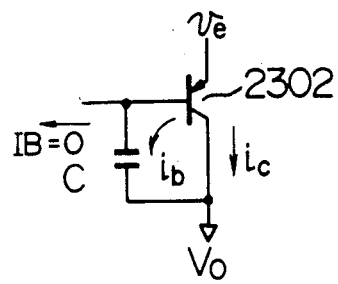
Figure 23D:
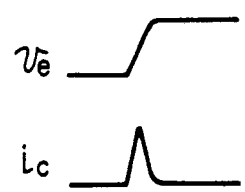

FIG. 19 shows an embodiment of a dynamic bus of discharge type according to the present invention.

In FIG. 19, numeral 1900 denotes a dynamic bus of discharge type, and numeral 1910 denotes a discharge circuit for presetting the bus 1900 to the "0" level of the original state. Numerals 1920 and 1930 denote bus drivers for outputting the result of predetermined logic to the bus 1900 under the control of control signals $T_3$ and $T_4$ in the nonactive interval of the discharge circuit 1910.

In the bus discharge circuit 1910, numeral 200 denotes the same circuit as the switching circuit shown in FIG. 2. An NMOS 1906 has a drain connected to the base of the PNP 201, a source connected to the reference potential, and a gate coupled to a discharge control signal CK. Gates of the NMOS 202 and the PMOS 203 are coupled to a signal obtained by inverting the CK in an inverter 1905 and to the CK, respectively. Further, the emitter of the PNP 201 is connected to the bus 1900.

The operation of the bus discharge circuit 1910 will now be described. When the bus is discharged, CK=1. At this time, therefore, the NMOS 1906 is set at ON condition, and the NMOS 202 and the PMOS 203 are set at OFF condition. As a result, the PNP 201 is set at ON condition, the bus 1900 being discharged to the "0" level. In FIG. 19, $C_L$ denotes a capacitive load connected to the bus 1900.

When the discharge control signal CK is set at the "0" level, the discharge circuit 1910 becomes nonactive. At this time, the NMOS 1906 is set at OFF condition, and the PNP 101 is also set at OFF condition.

On the other hand, the NMOS 202 and the PMOS 203 are set at ON condition. Accordingly, the base and the emitter of the PNP 201 are kept substantially at same potential.

The bus driver 1920 comprises an NPN 101 having a collector connected to the power source $V_1$, an emitter connected to the bus 1900, a PMOS 1901 and a PMOS 1902 connected in series between the collector and the base of the NPN 101 and respectively having gates respectively coupled to the bus output control signal $T_3$ and a data output signal c, and an NMOS 102 and a PMOS 103 connected in parallel between the base of the NPN 102 and the bus 1900 and having gates respectively coupled to the control signal $T_3$ and a signal obtained by inverting the $T_3$ in an inverter 1903.

Assuming now that the signal $T_3$ is at the "0" level and the output data signal c is at the "0" level, the PMOS 1901, the PMOS 1902 and the NPN 101 are set at ON condition, and the bus 1900 is switched to the "1" level. On the other hand, when c is at the "1" level, the NPN 101 is at OFF condition, and hence the bus 1900 is kept at the "0" level.

The other bus driver 1930 comprises a PMOS 1907 and a PMOS 1908 connected in series between the power source $V_1$ and the bus 1900, and respectively having gates respectively connected to the bus output control signal $T_4$ and a data output signal d.

Assuming now that the $T_4$ is at the "0" level and the output data signal d is at the "0" level, the PMOS 1907 and the PMOS 1908 are set at ON condition, and the bus 1900 is switched to the "1" level. On the other hand, when the signal d is at the "1" level, the bus 1900 is kept at the "1" level because the PMOS 1907 is at OFF condition.

When the bus 1900 is switched to the "1" level by either the bus driver 1920 or the bus driver 1930 under the condition that the bus discharge circuit 1910 is nonactive, the base potential of the PNP 201 changes so as to follow the potential change of the bus. A false base current generated by this base potential change is supplied from the bus 1900 through the NMOS 202 and/or the PMOS 203. Therefore, it is prevented that the PNP 201 is improperly set at ON condition by the false base current and a large improper current flows to the PNP 201.

When the bus 1900 is switched to the "0" level under the condition that the bus driver 1920 is nonactive and the bus discharge circuit 1910 is active, the base potential of the NPN 101 also changes so as to follow the potential change of the bus 1900. At this time, a false base current is generated by the change of the base potential. Since this current flows out to the bus 1900 through the NMOS 102 and/or the PMOS 103, however, it is prevented that the NPN 101 is improperly set at ON condition and a large improper current flows from the power source $V_1$.

FIG. 20 shows an embodiment of a bus of static type according to the present invention.

In FIG. 20, numeral 2000 denotes a static bus, and $C_L$ denotes a capacitive load coupled to the bus.

Numerals 2001 and 2003 denote bus drivers. Each of the bus drivers 2001 and 2003 comprises an embodiment of a bus driver according to the present invention as shown in FIGS. 8A, 9A, 11A, 12A, 14A or 16A. The bus driver 2001 is driven by a control signal $E_1$ and a signal obtained by inverting the control signal $E_1$ in an inverter 2002 to output an output data signal $a_1$ onto the bus 2000. In the same way, the bus driver 2003 is driven by a control signal $E_2$ and a signal obtained by inverting the control signal $E_2$ in an inverter 2004 to output an output data signal $a_2$ onto the bus 2000. An inverter 2005 is an input circuit for taking in data of the bus 2000.

Further, numeral 2006 denotes a well-known clocked inverter comprising a CMOS circuit. The clocked inverter 2006 is driven by a control signal $E_3$ and a signal obtained by inverting the control signal $E_3$ in an inverter 2007 to output an output data signal $b_1$ onto the bus 2000. Further, numeral 2010 denotes a well-known latch circuit comprising a CMOS circuit. The latch circuit 2010 takes in and holds data of the bus 2000 with the clock signal CK.

In such a bus system in which bus drivers comprising bipolar transistors are driven, it is essential that components of a nonactive bus driver are not damaged by electric stress and the nonactive bus driver is in the electrically complete quiescent state when the bus is charged or discharged by an active bus driver. As described with reference to embodiments thus far, components of each of the bus drivers 2001 and 2003 are not damaged by electrical stress however the potential of the bus 2000 may change when the bus driver is nonactive. Further, an electrically complete quiescent state can be realized. Therefore, an ideal static bus system can be realized.

FIG. 21 is a block diagram showing the configuration of a principal part of an embodiment of a data processing apparatus according to the present invention.

In FIG. 21, numeral 2102 denotes data processing means. The data processing means 2102 receives processing data from data buses 2103 and 2104. In response to a control command supplied from control means 2101, the data processing means 2102 executes data processing such as arithmetic operation and logical operation, and outputs the result onto a data bus 2106 via a bus driver 2105. Numeral 2107 denotes data storage means. In response to a command supplied from the control means 2101, the data storage means 2107 receives data from the data bus 2106 and stores the data. In response to a command supplied from the control means 2101, the stored data are read out onto the data buses 2103 and 2104 via bus drivers 2108 and 2109. Numerals 2110 and 2111 denote bus precharge means or bus discharge means. In case the data buses 2103 and 2104 are buses of precharge type, the means 2110 or 2111 precharges the data buses 2103 and 2104 in response to a command supplied from the control means 2101. In case the data buses 2103 and 2104 are buses of discharge type, the means 2110 or 2111 discharges the data buses 2103 and 2104 in response to a command supplied from the control means 2101. In case the data buses 2103 and 2104 are static buses, the bus precharge means or bus discharge means 2110 and 2111 are not necessary. Numerals 2112 and 2113 denote bus-through means. In response to a command supplied from the control means 2101, the bus-through means 2112 transfers data on the data bus 2106 to the data bus 2104. In the same way, the bus-through means 2113 transfers data on the data bus 2103 to the data bus 2106 in response to a command supplied from the control means 2101. Numeral 2114 denotes data receiver/transmitter means between the data processing means and an external device. In response to a command supplied from the control means 2101, the data receiver/transmitter means sends data on the data bus 2106 to outside or takes data from the outside onto the data bus 2106.

Numeral 2101 denotes control means, which controls the operation of the entire data processing apparatus. In FIG. 21, broken lines represent flows of control from the control means 2101 to respective portions of the processing apparatus.

The precharge circuit 1810 comprising a bipolar transistor as shown in FIG. 18A or the discharge circuit 1910 comprising a bipolar transistor as shown in FIG. 19A is used as the means 2110 and 2111.

In case at least one out of the bus drivers 2105, 2108 and 2109 and the bus-through circuits 2112 and 2113 comprises a static bus, a bus driver comprising a bipolar transistor as shown in the embodiments of FIGS. 8A to 18A is used. In case of a dynamic bus, the bus drivers 1910 and 1920 as shown in the embodiment of FIG. 19 are used.

In a data processing apparatus using bus drive means according to the present invention, the operation speed in the active state is significantly raised owing to the high load drive capability of a bipolar transistor. In addition, components are not damaged by electrical stress, and an electrically complete quiescent state is obtained in the nonactive state. As a result, a high-speed system having high reliability can be realized.

As understood from the description of the embodiments thus far, high speed operation in the active state is attained in a switching circuit comprising a bipolar transistor and a CMOS transistor. In addition, electric stress is not applied to components and an electrically complete quiescent state can be realized in the nonactive state. As a result, circuits and systems having high speed, high performance and high reliability be advantageously realized.

We claim:

1. A tri-state switching circuit having an active state in which an output terminal of the circuit is responsive to an input to the circuit and a quiescent state in which the output terminal is floating, comprising:
   a bipolar transistor having a collector, a base coupled to the input and an emitter;
   a first-conductivity type MOS transistor having drain and source connected to the base and emitter, respectively, of said bipolar transistor and a gate receiving a first control signal which controls selectively ON and OFF of said first-conductivity type MOS transistor;
   a second-conductivity type MOS transistor having source and drain connected to the base and emitter, respectively, of said bipolar transistor and a gate receiving a second control signal which controls selectively ON and OFF of said second-conductivity type MOS transistor; and
   control signal generating means for generating the first and second control signals selected so as to set both said first-conductivity type MOS transistor and said second-conductivity type MOS transistor at ON condition thereby causing the emitter and base of said bipolar transistor to be substantially at the same potential when said bipolar transistor is in the quiescent state.

2. A switching circuit according to claim 1, wherein said first control signal and said second control signal generated by said control signal generating means are opposite each other in polarity.

3. A switching circuit comprising:
   a first NPN transistor having a collector connected to a first power source terminal, an emitter connected to an output terminal and a base receiving a first input signal;
   a second NPN transistor having a collector connected to said output terminal, an emitter connected to a second power source terminal and a base receiving a second input signal;
   an NMOS transistor having a drain connected to the base of said first NPN transistor, a source connected to said output terminal and a gate receiving a first control signal which controls selectively ON and OFF of said NMOS transistor;
   a PMOS transistor having a source connected to the base of said first NPN transistor, a drain connected to said output terminal and a gate receiving a second control signal which controls selectively ON and OFF of said PMOS transistor; and
   a control signal generating unit for generating said first and second control signals selected so as to set both said NMOS transistor and said PMOS transistor at ON condition thereby causing said output terminal and the base of said first NPN transistor to be substantially at same potential when both of said first and second NPN transistors are at OFF condition.

4. A switching circuit comprising:
   an input terminal for receiving an input signal;
   an NPN transistor having a collector connected to a first power source terminal, an emitter connected to an output terminal and a base receiving said input signal;
   a PNP transistor having an emitter connected to said output terminal, a collector connected to a second power source terminal and a base receiving said input signal;
   an NMOS transistor having a drain connected to the base of said NPN transistor, a source connected to said output terminal and a gate receiving a first control signal which controls selectively ON and OFF of said NMOS transistor;
   a PMOS transistor having a source connected to the base of said NPN transistor, a drain connected to said output terminal and a gate receiving a second control signal which controls selectively ON and OFF of said PMOS transistor; and
   a control signal generating unit for generating said first and second control signals selected so as to set both said NMOS transistor and said PMOS transistor at ON condition thereby causing said output terminal and said input terminal to be substantially at same potential when both said NPN transistor and said PNP transistor are at OFF condition.

5. A switching circuit comprising:
   an input terminal for receiving an input signal;
   an NPN transistor having a collector connected to a first power source terminal, an emitter connected to an output terminal and a base receiving said input signal;
   a PNP transistor having an emitter connected to said output terminal, a collector connected to a second power source terminal and a base receiving said input signal;
   an NMOS transistor having a drain connected to the base of said NPN transistor, a source connected to said output terminal and a gate receiving a first control signal which controls selectively ON and OFF of said NMOS transistor;
   a PMOS transistor having a source connected to the base of said NPN transistor, a drain connected to said output terminal and a gate receiving a second control signal which controls selectively ON and OFF of said PMOS transistor; and
   a control signal generating unit for generating said first and second control signals selected so as to set both said NMOS transistor and said PMOS transistor at ON condition thereby causing said output terminal and said input terminal to be substantially at same potential when both said NPN transistor and said PNP transistor are at OFF condition,
   further comprising resistor means between said input terminal and said output terminal.

6. A switching circuit comprising:
   a first input terminal for receiving a first input signal;
   a second input terminal for receiving a second input signal;
   an NPN transistor having a collector connected to a first power source terminal, an emitter connected to a first output terminal and a base receiving said first input signal;

a first NMOS transistor having a drain connected to said first terminal, a source connected to a second output terminal and a gate receiving said second input signal;

a second NMOS transistor having a drain connected to the base of said NPN transistor, a source connected to said first output and a gate receiving a first control signal which controls selectively ON and OFF of said second NMOS transistor;

a PMOS transistor having a source connected to the base of said NPN transistor, a drain connected to said first output terminal and a gate receiving a second control signal which controls selectively ON and OFF of said PMOS transistors; and a control signal generating unit for generating said first and second control signals selected so as to set both said second NMOS transistor and said PMOS transistor at ON condition thereby causing said first output terminal and said first input terminal to be substantially at same potential when both said NPN transistor and said first NMOS transistor are at OFF condition.

7. A switching circuit comprising:

a PMOS transistor having a drain connected to a first output, a source connected to a second output and a gate receiving a first input signal;

a PNP transistor having a collector connected to a second power source terminal, an emitter connected to said first output terminal and a base receiving a second input signal;

an NMOS transistor having a drain connected to said first output terminal, a source connected to the base of said PNP transistor and a gate receiving a first control signal;

a second PMOS transistor having a source connected to said first output terminal, a drain connected to the base of said PNP transistor and a gate receiving a second control signal; and a signal generating unit for generating said first and second control signals selected so as to set both said NMOS transistor and said second PMOS transistor at ON condition thereby causing said first output terminal and the base of said PNP transistor to be substantially at same potential when both said first PMOS transistor and said PNP transistor are at OFF condition.

8. A tri-state circuit comprising:

a first NPN transistor having a collector connected to a first power source terminal and an emitter connected to an output terminal;

a second NPN transistor having a collector connected to said output terminal and an emitter connected to reference potential;

a first NMOS transistor having a drain and a source connected to the base and the emitter, respectively, of said first NPN transistor and a gate receiving a first tri-state control signal which controls selectively ON and OFF of said first NMOS transistor;

a first PMOS transistor having a drain and a source connected to the base and the emitter, respectively, of said first NPN transistor and a gate receiving a second tri-state control signal which controls selectively ON and OFF of said first PMOS transistor;

a PMOS logic connected between said first power source terminal and the base of said first NPN transistor and including a second PMOS transistor having a gate receiving said first tri-state control signal for controlling selectively ON and OFF thereof and a PMOS combination connected in series with said second PMOS transistor and including at least one third PMOS transistor having gate means receiving at least one input signal for controlling ON and OFF of said at least one PMOS transistor;

a first NMOS logic connected between the base of said first NPN transistor and the reference potential and including a second NMOS transistor having a gate receiving said second tri-state control signal for controlling selectively ON and OFF thereof and an NMOS combination connected in series with said second NMOS transistor and including at least one third NMOS transistor having gate means receiving at least one input signal for controlling ON and OFF of said at least one NMOS transistor;

a second NMOS logic connected between said output terminal and the base of said second NPN transistor and including a fourth NMOS transistor having a gate receiving said second tri-state control signal for controlling selectively ON and OFF thereof and an NMOS combination connected in series with said fourth NMOS transistor and including at least one fifth NMOS transistor having gate means receiving at least one input signal for controlling ON and OFF of said at least one NMOS transistor;

a sixth NMOS transistor having a drain connected to the base of said second NPN transistor, a source connected to the reference potential and a gate receiving the first tri-state control signal which controls selectively ON and OFF of the sixth NMOS transistor; and base charge discharging means connected between the base of the second NPN bipolar transistor and said reference potential.

9. A tri-state circuit comprising:

a first NPN transistor having a collector connected to a first power source terminal and an emitter connected to an output terminal;

a second NPN transistor having a collector connected to said output terminal and an emitter connected to reference potential;

a first NMOS transistor having a drain and a source connected to the base and the emitter, respectively, of said first NPN transistor and a gate receiving a first tri-state control signal which controls selectively ON and OFF of said first NMOS transistor;

a first PMOS transistor having a drain and a source connected to the base and the emitter, respectively, of said first NPN transistor and a gate receiving a second tri-state control signal which controls selectively ON and OFF of said first PMOS transistor;

a PMOS logic connected between said first power source terminal and the base of said first NPN transistor and including a second PMOS transistor having a gate receiving said first tri-state control signal for controlling selectively ON and OFF thereof and a PMOS combination connected in series with said second PMOS transistor and including at least one third PMOS transistor having gate means receiving at least one input signal for controlling ON and OFF of said at least one PMOS transistor;

a first resistor connected between the base of said first NPN transistor and said output terminal;

an NMOS logic connected between said output terminal and the base of said second NPN transistor and including a second NMOS transistor having a gate receiving a second tri-state control signal for controlling selectively ON and OFF thereof and an NMOS combination connected in series with said second NMOS transistor and including at least one third NMOS transistor having gate means receiving at least one input signal for controlling ON and OFF of said at least one NMOS transistor;

a fourth NMOS transistor having a drain connected to the base of said second NPN transistor, a source connected to the reference potential and a gate receiving the first tri-state control signal which controls selectively ON and OFF of the fourth NMOS transistor; and a second resistor connected between the base of said NPN bipolar transistor and the reference potential.

10. A tri-state circuit comprising:

an NPN transistor having a base, a collector connected to a first power source terminal and an emitter connected to an output terminal;

a PNP transistor having a base, an emitter connected to the output terminal and a collector connected to reference potential;

a first NMOS transistor having a drain connected to the base of said PNP transistor, a source connected to the output terminal and a gate receiving a first control signal which controls selectively ON and OFF of said first NMOS transistor;

a first PMOS transistor having a source connected to the bases of said NPN transistor and said PNP transistor, a drain connected to said output terminal, and a gate receiving a second tri-state control signal for controlling selectively ON and OFF thereof;

a PMOS logic connected between said first power source terminal and the bases of said NPN transistor and said PNP transistor and including a second PMOS transistor having a gate receiving said first tri-state control signal for controlling selectively ON and OFF thereof and a PMOS combination connected in series with said second PMOS transistor and including at least one third PMOS transistor having gate means receiving at least one input signal for controlling ON and OFF of said at least one PMOS transistor; and an NMOS logic connected between the bases of said NPN transistor and said PNP transistor and the reference potential and including a second NMOS transistor having a gate receiving said second tri-state control signal for controlling selectively ON and OFF thereof and an NMOS combination connected in series with said second NMOS transistor and including at least one third NMOS transistor having gate means receiving at least one input signal for controlling ON and OFF of said at least one NMOS transistor.

11. A tri-state circuit according to claim 10, further comprising resistor means connected between the bases of the NPN transistor and the PNP transistor and the output terminal.

12. A tri-state circuit comprising:

an NPN transistor having a base, a collector connected to a first power source terminal and an emitter connected to an output terminal;

a first NMOS logic connected between the output terminal and the reference potential and including an NMOS transistor having a gate receiving a first tri-state control signal for controlling selectively ON and OFF thereof and an NMOS combination connected in series with said NMOS transistor and including at least one second NMOS transistor having gate means receiving at least one input signal for controlling ON and OFF of said at least one NMOS transistor;

a PMOS logic connected between said first power source terminal and the base of said NPN transistor and including a first PMOS transistor having a gate receiving a second tri-state control signal for controlling selectively ON and OFF thereof and a PMOS combination connected in series with the first PMOS transistor and including at least one second PMOS transistor having gate means receiving at least one input signal for controlling ON and OFF of said at least one PMOS transistor;

a second NMOS logic connected between the base of the NPN transistor and the reference potential and including a third NMOS transistor having a gate receiving the first tri-state control signal for controlling selectively ON and OFF thereof and an NMOS combination connected in series with said third NMOS transistor and including at least one fourth NMOS transistor having gate means receiving at least one input signal for controlling ON and OFF of said at least one NMOS transistor;

a fifth NMOS transistor having a drain and a source connected to the base and the emitter, respectively, of said NPN transistor and a gate receiving the second tri-state control signal which controls selectively ON and OFF of the fifth NMOS transistor; and a third PMOS transistor having a source and a drain connected to the base and the emitter, respectively, of said NPN transistor and a gate receiving the first tri-state control signal which controls selectively ON and OFF of said third PMOS transistor.

13. A tri-state circuit comprising:

a PMOS logic connected between a first power source terminal and an output terminal and including a first PMOS transistor having a gate receiving a first tri-state control signal for controlling selectively ON add OFF thereof and a PMOS combination connected in series with said first PMOS transistor and including at least one second PMOS transistor having gate means receiving at least one input signal for controlling ON and OFF of said at least one PMOS transistor;

a PNP transistor having a base, an emitter connected to said output terminal and a collector connected to reference potential;

a first NMOS transistor having a drain connected to said output terminal, a source connected to the base of the PNP transistor, and a gate receiving the first tri-state control signal which controls selectively ON and OFF of said first NMOS transistor;

a third PMOS transistor having a source connected to the output terminal, a drain connected to the base of the PNP transistor and a gate receiving a second tri-state control signal which selectively controls ON and OFF of the third PMOS transistor; and an NMOS logic connected between the base of the PNP transistor and the reference potential and including a second NMOS transistor having a gate receiving said second tri-state control signal for controlling selectively ON and OFF thereof and an NMOS combination connected in series with said second NMOS transistor and including at least one third NMOS transistor having gate means receiving at least one input signal for controlling ON and OFF of said at least one third NMOS transistor.

14. A bus precharge circuit comprising:
an NPN transistor having a base, a collector connected to a first power source terminal and an emitter connected to a bus of precharge type;
a PMOS transistor having a source connected to the first power source terminal, a drain connected to the base of the NPN transistor, and a gate coupled to a precharge control signal;
an NMOS transistor having a drain connected to the base of said NPN transistor, a source connected to said bus and a gate coupled to said precharge control signal; and
a PMOS transistor having a drain connected to the base of said NPN transistor, a source connected to the bus and a gate coupled to an inverted signal of the precharge control signal.

15. A discharge circuit for bus of discharge type comprising:
a PNP transistor having a base, an emitter connected to a bus of discharge type, and a collector connected to reference potential;
an NMOS transistor having a drain connected to the base of said PNP transistor, a source connected to the reference potential and a gate coupled to a discharge control signal;
a PMOS transistor having a drain connected to said bus, a source connected to the base of the PNP transistor and a gate coupled to said discharge control signal; and
an NMOS transistor having a drain connected to said bus, a source connected to the base of the PNP transistor and a gate coupled to an inverted signal of the discharge control signal.

16. A bus output circuit comprising:
an NPN transistor having a base, a collector connected to the first power source terminal, an emitter connected to a bus of discharge type;
a PMOS logic connected between the first power source terminal and the base of said NPN transistor and including a PMOS transistor having a gate receiving a bus output control signal for controlling selectively ON and OFF thereof and a PMOS combination connected in series with the PMOS transistor and including at least one PMOS transistor having gate means receiving at least one input signal for controlling ON and OFF of said at least one PMOS transistor;
an NMOS transistor having a drain connected to the base of said NPN transistor, a source connected to the bus and a gate coupled to said bus output control signal; and
a PMOS transistor having a source connected to the base of said NPN transistor, a drain connected to the bus and a gate coupled to an inverted signal of the bus output control signal.

17. A static bus system including at least two static bus output circuit and at least one bus signal receiver circuit, at least one of said bus output circuits comprising:
at least one bipolar transistor having an emitter connected to an output terminal of said one bus output circuit; and
a PMOS transistor and an NMOS transistor each having a source connected to the base of said bipolar transistor, and a drain connected to the output terminal and each being set at ON condition when the bus output circuit is not operating.

18. A data processing apparatus including data processing means, data storage means, a plurality of bus means for connecting the data processing means to the data storage means, data output means for coupling outputs of the data processing means and the data storage means to the bus means, and control means for controlling the data processing means, the data storage means, the bus means and the data output means, at least one of said data output means comprising:
at least one bipolar transistor having an emitter connected to an output terminal of the data output means; and
a PMOS transistor and an NMOS transistor each having a source connected to the base of said bipolar transistor, and a drain connected to the output terminal and each being set at ON condition when the data output means is not operating.

19. A data processing apparatus according to claim 18, further comprising bus-through means for interconnecting buses to transfer data therebetween, said bus-through means comprising:
at least one bipolar transistor having an emitter connected to an output terminal of the bus-through means; and
a PMOS transistor and an NMOS transistor each having a source connected to the base of said bipolar transistor, and a drain connected to the output terminal and each being set at ON condition when the bus-through means is not operating.

20. A data processing apparatus, at least one of a plurality of bus means comprising a dynamic bus of precharge type or discharge type, at least one of means for precharging or discharging said bus comprising:
at least one bipolar transistor having an emitter connected to an output terminal of the precharge or discharge means; and
a PMOS transistor and an NMOS transistor each having a source connected to the base of said bipolar transistor, and a drain connected to the output terminal and each being set at ON condition when the precharge means or the discharge means is not operating.

21. A data processing apparatus according to claim 20, wherein the plurality of bus means comprise at least a static bus and a dynamic bus.

22. A tri-state semiconductor circuit having an active state in which an output terminal of the circuit is responsive to an input to the circuit and a quiescent state in which the output terminal is floating, comprising:
a bipolar transistor having a collector connected to a power source terminal, an emitter connected to the output terminal and a base coupled to the input; and
active circuit means connected between the base of said bipolar transistor and the output terminal and responsive to a control signal applied thereto to be rendered conductive so that the output terminal and the base of said bipolar transistor are at substantially the same potential when said bipolar transistor is in the quiescent state.

23. A tri-state semiconductor circuit having an active state in which an output terminal of the circuit is responsive to an input to the circuit and a quiescent state in which the output terminal is floating, comprising:
a bipolar transistor having a collector connected to reference potential, an emitter connected to the output terminal and a base coupled to the input; and
active circuit means connected between the base of said bipolar transistor and the emitter thereof and responsive to a control signal applied thereto to be rendered conductive so that the base and the emitter of said bipolar transistor are at substantially the same potential when said bipolar transistor is in the quiescent state.

* * * * *